(12) United States Patent
Raidl

(10) Patent No.: US 10,930,588 B2
(45) Date of Patent: Feb. 23, 2021

(54) REDUCTION OF OHMIC LOSSES IN MONOLITHIC CHIP INDUCTORS AND TRANSFORMERS OF RADIO FREQUENCY INTEGRATED CIRCUITS

(71) Applicant: Intel Corporation, Santa Clara, CA (US)

(72) Inventor: Alfred Erik Raidl, Linz (AT)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 16/235,659

(22) Filed: Dec. 28, 2018

(65) Prior Publication Data

US 2020/0211960 A1 Jul. 2, 2020

(51) Int. Cl.
*H01L 23/522* (2006.01)
*H01L 23/66* (2006.01)
*H01L 49/02* (2006.01)

(52) U.S. Cl.
CPC ......... *H01L 23/5227* (2013.01); *H01L 23/66* (2013.01); *H01L 28/10* (2013.01)

(58) Field of Classification Search
CPC .... H01F 41/041; H01F 17/0006; H01F 5/003; H01L 28/10; H01L 23/645
USPC ............. 216/15; 257/E21.022; 336/200, 232
See application file for complete search history.

(56) References Cited

U.S. PATENT DOCUMENTS

| | | | |
|---|---|---|---|
| 7,902,953 B1 | 3/2011 | Watt | |
| 9,653,204 B2* | 5/2017 | Vanukuru | H01F 17/0006 |
| 2003/0229982 A1* | 12/2003 | Vilander | H01F 17/0006 |
| | | | 29/602.1 |
| 2004/0017278 A1* | 1/2004 | Castaneda | H01F 21/12 |
| | | | 336/200 |
| 2014/0118963 A1* | 5/2014 | Lenive | H01L 23/5225 |
| | | | 361/748 |
| 2015/0364241 A1* | 12/2015 | Groves | H01F 41/041 |
| | | | 336/200 |
| 2015/0364248 A1 | 12/2015 | Groves | |

FOREIGN PATENT DOCUMENTS

| | | |
|---|---|---|
| DE | 10261385 A1 | 7/2004 |
| EP | 2535931 A2 | 12/2012 |
| WO | 2018122949 A1 | 7/2004 |

OTHER PUBLICATIONS

International Search Report and Written Opinion dated Feb. 5, 2020 in connection with International Patent Application PCT/US2019/058767.

* cited by examiner

Primary Examiner — Jonathan Han
(74) Attorney, Agent, or Firm — Viering, Jentschura & Partner MBB

(57) ABSTRACT

An inductor or transformer with the inductor can include one or more windings split into strands along a radial path of the winding and provide for a more uniform current distribution across a width of the winding. The winding(s) can comprise twisting components as twistings or strand crossings located at various locations along the winding. The twisting components span the winding along a winding width with a connector or crossing strand and change a position of one strand to another at points that different strands of the winding are cut or spliced.

22 Claims, 16 Drawing Sheets

REDUCTION OF OHMIC LOSSES IN MONOLITHIC CHIP INDUCTORS AND TRANSFORMERS OF RADIO FREQUENCY INTEGRATED CIRCUITS

FIELD

The present disclosure relates to monolithic inductors and transformers, and more specifically, reducing ohmic losses in monolithic inductors and transformers of radio frequency integrated circuits (RFICs).

BACKGROUND

Many monolithic inductors or transformer designs on radio frequency integrated circuits (RFICs) suffer from tremendous impact of radio frequency (RF) skin and RF proximity effects, especially with respect to Ohmic losses at gigahertz (GHz) frequencies. Thus, even if an inductor's Ohmic Resistance at zero frequency (DC) is fairly low, the real part (Real) of its RF impedance Z(f) can easily reach twice and triple this value already at single-digit GHz frequencies, due to the adverse combination of these effects. At millimeter wave (mmWave) frequencies (e.g., at 24/28/39/60/77 GHz, higher GHz, or lower GHz) these effects can be even more pronounced.

Partly, the ever-present problem of Ohmic losses can be mitigated by implementation of inductors and transformers in substantially thick and highly conductive layers of the back end of line (BEOL) stack of the respective integrated circuit (IC) technology as part of fabrication processing. But even in this case, still a fundamental limit of electromagnetic (EM) field physics prevails: RF Skin effect limits the penetration depth into the conductor—and thus, the maximum available cross-section for conduction of RF currents is greatly reduced, even if a conductor is made very thick and wide. In addition to this, further reduction of the effective conducting cross-section area is in many cases caused by RF proximity effect, where currents in adjacent windings influence each other by their surrounding magnetic fields.

A common figure of merit for inductors is the achievable Quality Factor (Q) represented as follows:

$$Q = \text{Imag}\{Z(f)\}/\text{Real}\{Z(f)\} \qquad \text{Eqn (1)}.$$

The Q factor is thus highly dependent on the Ohmic losses, represented by the Real part of Z(f) in the denominator. The Q factor usually is desired to be as high as possible—at the respective operating frequency or in a given operating frequency range. As such, equation (Eqn) 1 explains the desire to lower the losses, in which the lower the losses, the higher the Q factor will be.

The magnetic fields created by the current in a current path inside the inductor cannot be assumed to be flowing equally across cross-sections (e.g., volume current distribution (Jvol)) of the current path that the current is flowing equally in the cross sections. The fields can create some bottleneck within the path such as by nearby/external/outside magnetic field distributions (H). Thus, there is a need to address these issues for the sake of power efficiency/saving, fabrication processing, and efficacy of the inductor or transformer, especially with respect to non-DC or non-changing fields at operation frequencies of RFICs.

DETAILED DESCRIPTION

Figure 1:
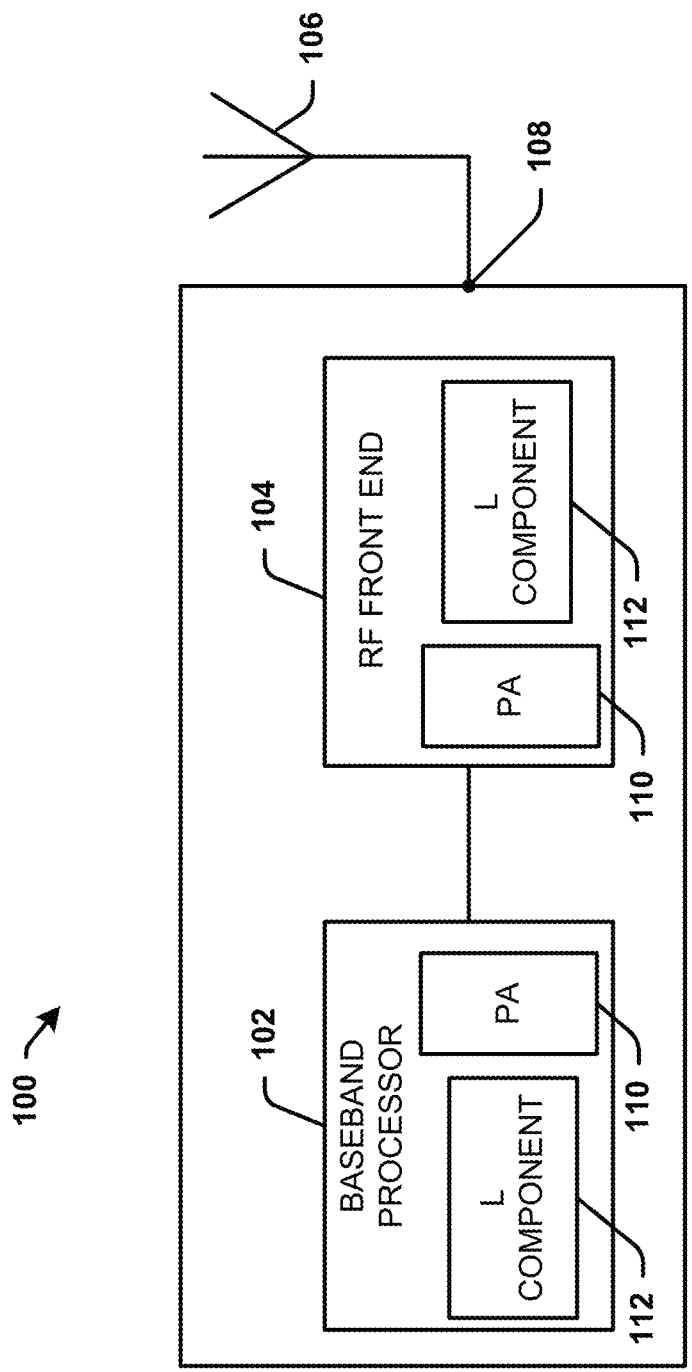
FIG. 1 is exemplary architecture of mobile device, or communication equipment for an inductor component implementing various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, a programmable processing circuit, a programmable array, electronic circuitry, or a computer with a processing device with circuitry. By way of illustration, an application running on a server and the server can also be a component. One or more components can reside within a process, and a component can be localized on one computer and/or distributed between two or more computers.

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus, or operably coupled to a power amplifier/inductor/transformer on an RF front end/Baseband side, and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components. As used herein, a mechanism can be one or more components, such as a capacitor compensation mechanism/component, for example, the mechanism/component is intended to denote a structure as a mechanism or component modified by a capacitor, a compensation, or both a capacitor and a compensation, for example.

A set of elements or a set of other components can be described herein, in which the term "set" can be interpreted as "one or more." In addition, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies, various embodiments are described herein to fabricate and design inductors or transformers that overcome skin and proximity effects to a greater degree. Inductors can be manufactured for a greater distribution of current flow throughout and within cross-sections of a winding of the inductor or electronic components comprising an inductor (e.g., a transformer or the like), thereby mitigating RF skin effects. Additionally, twisting components (or portions) with strand crossings can be provided at various locations of an inductor winding along a radial path to reduce/mitigate RF skin effects and RF proximity effects.

In an aspect (or embodiment), an inductor component/device of a radio frequency integrated circuit (RFIC) can include a monolithic inductor that includes one or more inductor windings. The monolithic inductor can comprise at least one first winding and at least one second winding, for example. The first winding comprises a number of N strands, where N is an integer greater than one. The strands can be formed by splitting a solid inductor winding into a plurality of strands. The strands thus can be made as individual conductors separated from one another and spaced apart (e.g., as a part of and within the inductor winding width) such that the solid winding now includes a plurality of conductive strands within the same width or space as the winding or another second winding; together the strands are configured and operable as a single inductor winding from among two or more windings of the monolithic inductor.

In an aspect, a twisting component/device/portion/segment/mechanism can be provided at various locations along the first winding(s), the second winding(s), or both first winding(s) and second winding(s) of the inductor. At respective locations along a winding of the inductor, the twisting components can be coupled to the strands and span at least one strand from a cut portion at a location to the position of another strand at another cut portion of another strand within the location. The two cuts can be proximate to and offset from one another at the location.

For example, within the winding the twisting component can connect a first strand (e.g., an inner-most strand) of the plurality of strands to a second stand (e.g., an outer-most strand) of the plurality of strands, which can span across any number of strands at this location/section of the inductor winding. In another example, along the inductor winding path as whole winding with the plurality of inductors, the winding can continue along the winding path (e.g., an angular winding path) of conduction before joining to another winding by a windings cross(ing) or the like to continue along another radial winding path, or be a single winding.

In other aspects, a transformer can comprise the monolithic inductor as a primary/secondary inductor with the twisting components at the different locations of the at least one first winding. The transformer can further include a second monolithic inductor as a primary/secondary inductor arranged with respect to the monolithic inductor and configured to electromagnetically couple to, or mutually resonate with the other monolithic inductor. In one example, the second monolithic inductor can be substantially on a plane with respect to the monolithic (first) inductor, forming the transformer; other designs other than just concentric in shape can also be envisioned, such as radially square or the like, around a center point as one of ordinary skill in the art could envision.

In particular, the twisting components can also be considered or referred to as crossing(s), twisting(s), twisting scheme(s), strand crossing(s), strand twisting(s), or other similar term or phrase herein, and is to be distinguished from and different from a "windings cross" or other similar term of art that specifies a joining of separate windings to one another as part of the different windings of an inductor or transformer.

As referred to herein, a winding comprises a conductive portion or one conductive path as a portion of the inductor around a center. A winding and a strand can be distinguished by strands being in sets or groups of strands or conductive strips of the winding that form a single conductive strip of a winding. Each winding can be connected to another winding by a windings cross, at each strand of a set of strands of a winding to another winding (as a solid winding, or stranded winding with strands also comprising the otherwise solid winding width). A winding can be a conductive path or coil of an inductor that extends radially as an angular path at least three hundred and sixty degrees around a center point. A half winding, for example, can include a portion of a winding such as about 180 degrees around a center point, for example.

Additional aspects and details of the disclosure are further described below with reference to figures.

Referring to FIG. 1, illustrated is an exemplary communication or mobile device 100 comprising an inductor component in accordance with various aspects being described. The device 100 can comprise a mobile or wireless device, for example, and can further include a digital baseband processor 102, an RF frontend 104 and an antenna port 108 for connecting to an antenna 106. The device 100 can further comprise an exemplary driver/power amplifier 110 as a part of the digital baseband processor 102 or the RF frontend 104. The digital baseband processor 102 or the RF frontend 104 can further comprise an inductor component 112 coupled to the power amplifier 110, the digital baseband processor 102, or the RF frontend 104, as an external device, or integrated within or as a part of any of the devices thereof (e.g., as in an RFIC, SoC, or the like). The RF frontend 104 can also be coupled to the digital baseband processor 102 and the antenna port 108, which is configurable with the antenna 106.

In an example, the power amplifier 110 can operate to provide a power signal along a transmitter path for transmissions according to various operating bands. The power amplifier 110 can operate in multi-band or multi-mode operations to simultaneously support multiple communication standards with various operating bands. Rapidly growing demands have posed challenges for future radio frequency (RF) transmitter development, especially power amplifiers. One solution for a multi-band power amplifier can be to directly assemble several single-band PAs either in a chip or on a multiple-chip module. However, this can possibly incur large chip/module area, increased cost, a dedicated antenna interface to each power amplifier, possibly the need for off-chip switches or complicated packaging. Additionally, tunable passive networks (e.g., tunable passive networks, capacitor(s), resistor(s), inductor(s), transformer(s), or the like) can also be utilized to achieve multi-band impedance matching and power combining for RF power amplifiers, such as with the inductor component 112 as a part of potential solutions to passive losses, tuning range options, as well as reliability concerns, all of which can be affected by an increase in skin effects as well as proximity field effects of the inductor.

In an aspect, the inductor component 112 can comprise one or more devices, electric circuits, circuit components, or the like communicatively coupled to, connected or coupled to, integrated with one or more inductors as inductor components 112, as well as operate at operating frequencies in a GHz range (e.g., from one gigahertz to 99 GHz, millimeter Wave (mmWave) frequencies, a half a Gigahertz, 60 Hz, 40 Hz, or higher). Further, multiple inductor components 112 also can be configured as one or more transformers according to various details, aspects, or embodiments described herein.

In various aspects, the inductor component 112 can be configured to reduce skin effects and proximity field effects. A winding of the inductor, for example, can be modified into N strands, in which N can be an integer of at least two. The strands of a winding can be configured to reduce or mitigate skin effects by increasing an effective cross-section area of the winding available for conduction of radio frequency (RF) currents in response to the radio frequency integrated circuit operating within a frequency range (e.g., a Gigahertz frequency range).

The inductor component 112 can also comprising a plurality of twisting components as cross strands or twisting strand at different locations of a winding extending along a winding path (e.g., at least 360 degrees with respect to a center point). The twisting components can be configured to reduce or mitigate RF proximity field effects within or originating from a first winding interacting with a second winding, or vice versa, as well as compared to another coil or inductor comprise of a solid winding (e.g., a solid metal or composite winding) therein, or an inductor with all solid windings (e.g., another inductor of a transformer, or the like).

Figure 2:
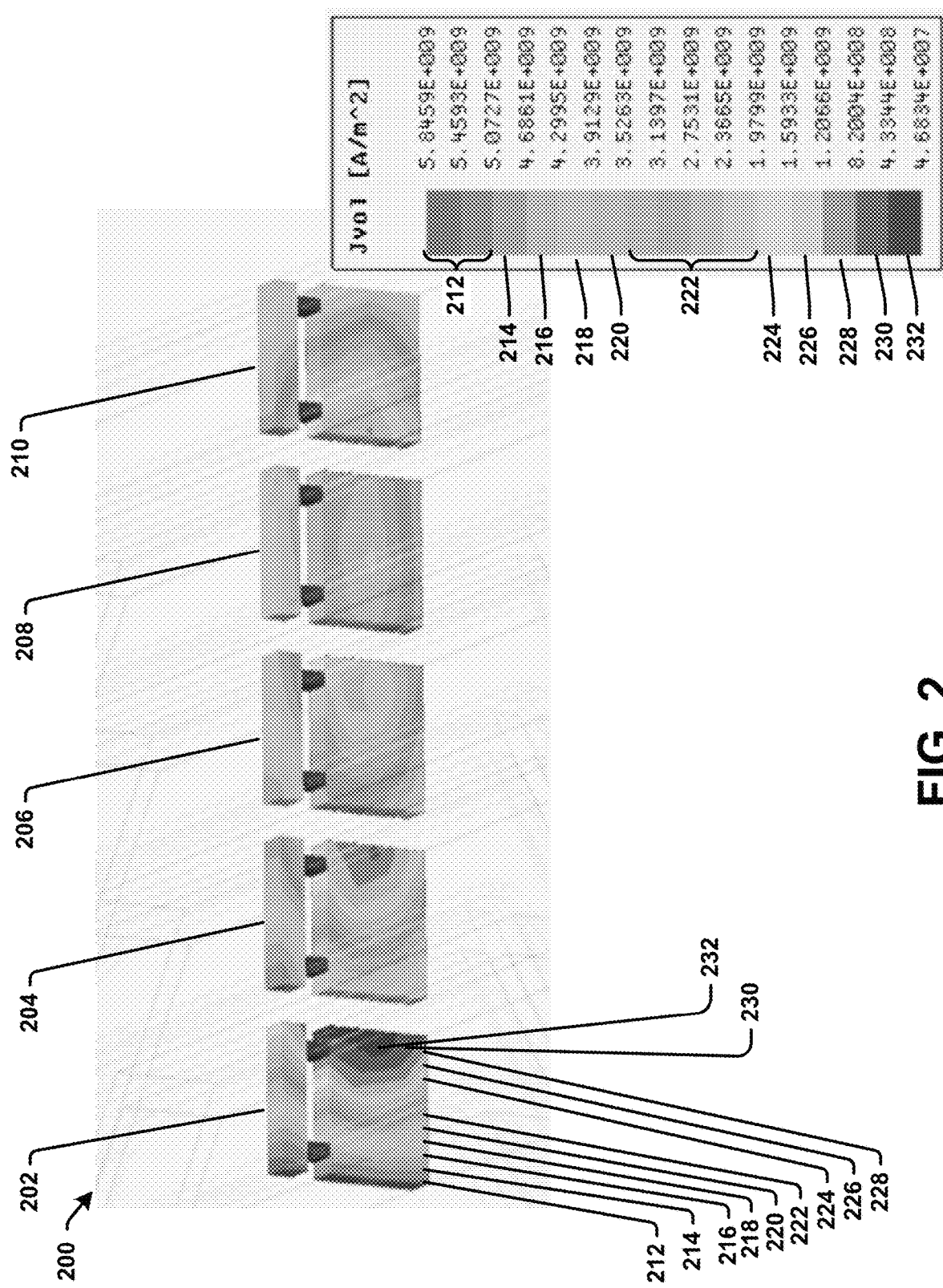
FIG. 2 is an example of an electromagnetic (EM) field distribution within inductor windings in accordance with various aspects described.

Referring to FIG. 2, illustrated is an example of RF skin and proximity effects that can be generated along different windings of an inductor. Specifically, five windings comprising associated cross-sectional areas 202 thru 210 of each winding are illustrated as an electromagnetic (EM) field distribution Jvol (volume current). Each cross-sectional area of each winding 202 thru 210 demonstrates sections associated with a current gradient 212 thru 232, for example, that changes in current density as a result of RF skin effects influencing the current flow there-through.

As can be seen across the different current sections 212 thru 232 of the cross-sectional areas across each winding 202-210, the current is not flowing equally. The volume current (Jvol) created by the current path inside the inductor windings cannot be assumed that to be flowing equally in the cross sections. For example, on one extreme 230-232 current is only flowing at a fraction of the current density as observed on the other extreme (e.g., current sections 212 to 216). The fields of other windings create some bottlenecks in current flow more at other windings, for example, especially at inner windings to the left compared to the outer windings at the right.

Consequently, an increase in Ohmic losses over frequency due to RF skin and proximity effect can be observed. To a great extent, the dramatic loss increase on the left inner windings more so can be cause by only a few windings only, in most cases the inner and to a lesser degree the outer windings due mostly to an RF proximity effect.

Figure 3:
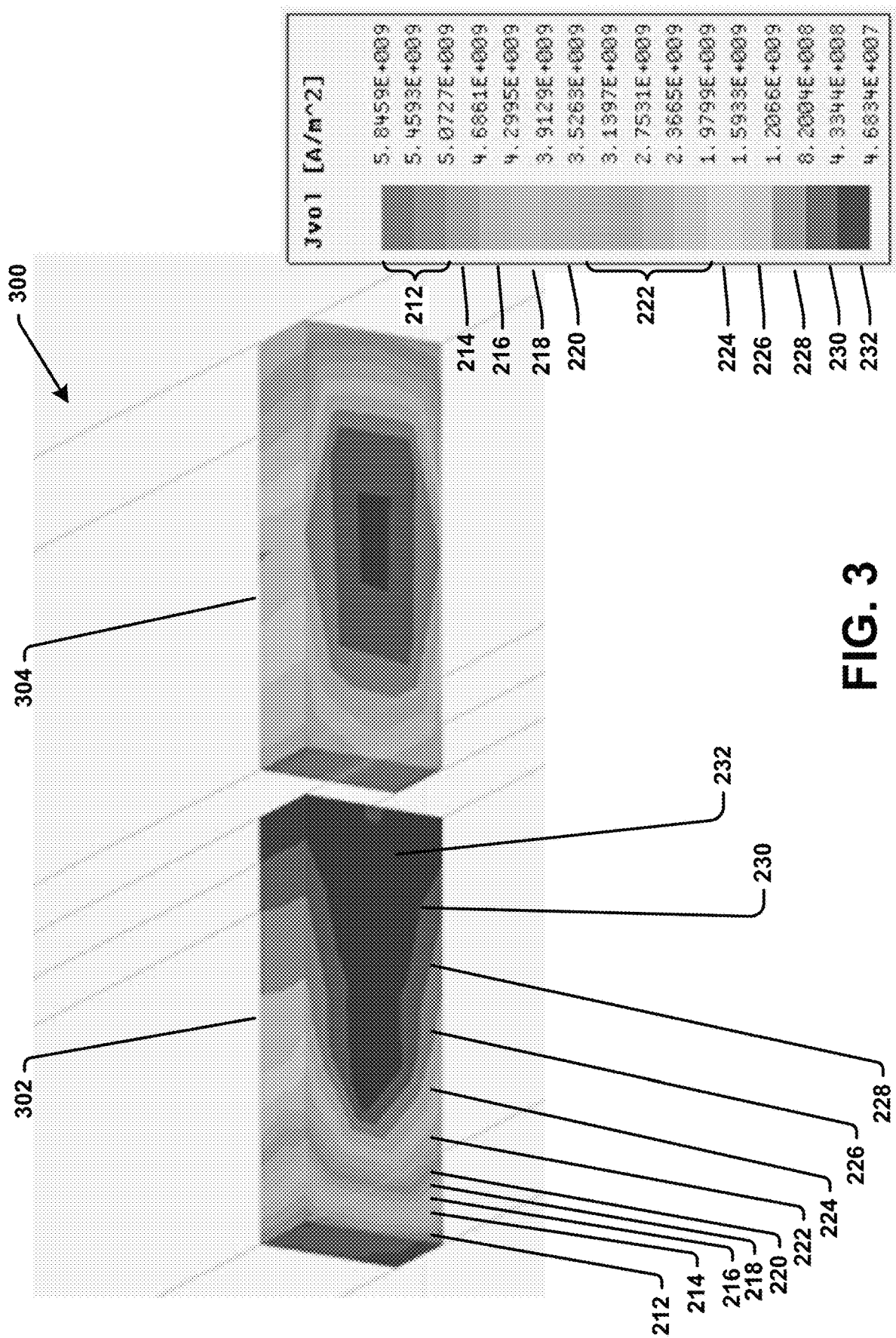
FIG. 3 is another example of an electromagnetic (EM) field distribution within inductor windings in accordance with various aspects described.

Referring to FIG. 3, illustrated is another example of RF skin and proximity effects that can be generated along different windings of an inductor, mostly illustrating the RF skin effect as a primary factor according to an EM field distribution.

As one example, the left winding cross-section 302 can be an inner (or inner-most) winding where different cross-sectional areas within each cross-section 212 thru 232 demonstrate an associated current gradient, wherein 212-214 show a large flow of electrons in current as opposed to the vast cross sectional areas of 228-232 identifying close to nothing moving in the blue path.

In contrast to the left winding 302 cross-section, the right (outer/outer-most) winding 304 has a more uniform cross sectional current available for current, showing a greater effective cross-section area of the first winding available for conduction of radio frequency (RF) currents, as such the proximity effect of the outer winding 304 to the inner winding 304 is more pronounced, forcing the current to flow more on a surface, and more around the regional areas 212-214 where the winding is more conductive thereat.

Figure 4:
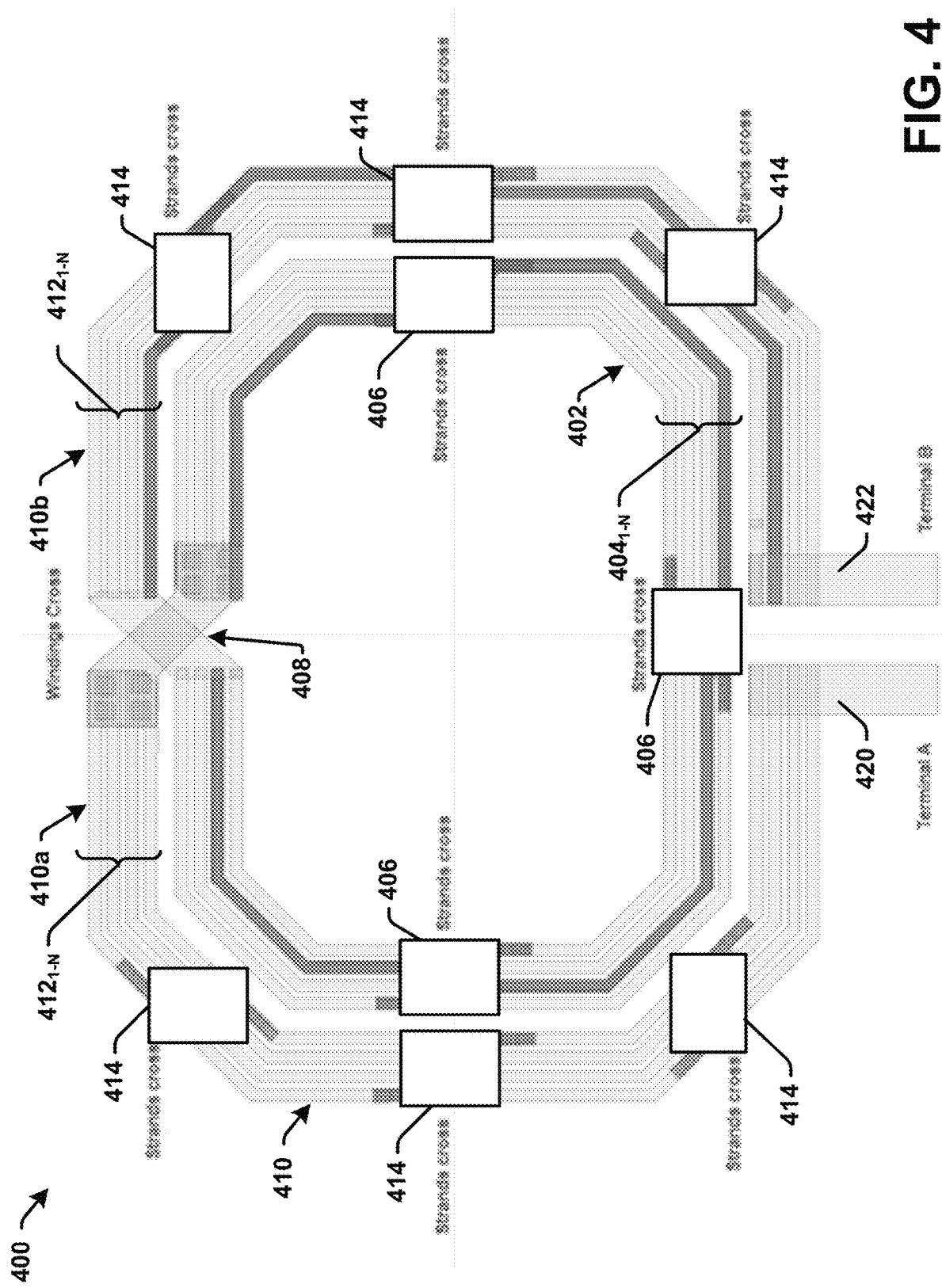
FIG. 4 is another example of an inductor in accordance with various aspects described.

Referring to FIG. 4, illustrated is an example inductor component according to various aspects herein. The inductor component 400 can be one example of the inductor component 112 of FIG. 1 as a monolithic inductor, and comprise two windings designated as a first winding 402 and a second winding 410 (e.g., an outer-most winding, or other winding of the inductor where the inductor comprises more than two windings, or configured as part of a transformer) and a first winding 402 (e.g., an inner-most winding, or other winding of the inductor where the inductor comprises more than two windings, or configured as part of a transformer), which are coupled to terminals 420 and 422 for receiving one or more signal inputs thereat as an electrical component that stores energy in a magnetic field when current conducts through the windings 410 and 402 as angular conductor paths. These first and second windings 402 and 410 (as an inner-most winding and an outer-most winding in the given example of FIG. 4) each follow a radial path (e.g., a concentric radial winding path or other shape around a center point) and can be joined at ends of each winding to one another at a terminal or together at a windings cross 408, for example.

The second winding 410 of this particular example can comprise two half windings as half second windings 410a and 410b. Each of the half second windings 410a and 410b can be coupled to the first winding 402 at end points by a windings cross 408. In this manner, the ends of the first winding 402 coupled to a different end of each half second winding 410a and 410b, respectively, in which opposite ends of the half second windings 410a and 410b couple to terminals 420 and 422, respectively, by a windings cross 408 as illustrated in this particular example.

A windings cross (e.g., the windings cross 408) can be configured to cross two different windings, either at each solid winding to another winding, as a solid winding to the strands of another winding, or strand to strand according to a position (e.g., inner-most strand of first winding to inner-most stand of second winding, and likewise for each strand of a winding to another winding) for example. The strands of a winding can form/comprise the same width of another winding, or at least a same width as a solid width of the same winding in the inductor, or include a separate volume of strips that compose a single winding along with another winding also composed of a similar volume of separate strips/strands, for example.

In an aspect, the windings 410 and 402 (as outer-most winding 410 and inner-most winding 402) of the inductor component 400 can be split into N strands $412_{1-N}$, $404_{1-N}$, respectively, from a solid winding and separated with about equal spacings (spaces/gaps) there-between within each winding. The number of strands can vary based on a minimum width of a solid winding (e.g., solid metal or composite of metal) based on or controlled by the integrated circuit (IC) fabrication process specification(s) or technology. Although the windings 410 and 402 are both illustrated as split into separate strands $412_{1-N}$, $404_{1-N}$ within each winding 410, 402 of the inductor component 400, other configurations are also envisioned; such as the winding 402 being solid and the winding 410 being stranded with N strands $412_{1-N}$, the winding 402 being stranded with N strands $404_{1-N}$ and the winding 410 being solid, or both being stranded as illustrated, for example.

In an example, the illustration of FIG. 4 can vary so that the second winding 410 can be a solid metal winding without strands $412_{1-N}$ or spacings (or spaces) in-between splits that run along the angular path of the second winding 410 of the inductor 400 as otherwise illustrated. The first winding 402 can also comprise strands $404_{1-N}$, so that the inductor 400 comprises the second winding 410 as a solid winding forming a solid metal second winding 410 without strands, while the first winding 402 can comprise strands $404_{1-N}$.

The strands $404_{1-N}$ of the first winding 402 can be composed of the same metal or other composition as one another and as the solid second winding 410, whether the second winding 410 is entirely solid or cut into strands $412_{1-N}$, for example.

In an aspect, the second winding 410, as illustrated in the example of FIG. 4, comprises a number (N) of strands $412_{1-N}$, which are illustrated in number as four strands within each of a half second winding 410a and a half second winding 410b. Although four strands $412_{1-N}$ for the second winding 410 are illustrated, the number of strands 410a and 410b can be a different number of strands, such as two, three, four, five, or N strands with N, in which each half winding 410a and 410b comprises at least two strands $412_{1-N}$. Similarly to the second winding 410 as illustrated, the first winding 402 can comprise a plurality of strands $404_{1-N}$ numbering four, but also can be formed from more or less strands in number N, not less than two.

In an aspect, the stranded winding(s), either the first winding 402 alone, the second winding 410, or both can be configured with narrow parallel strands within each winding path around a center point and enable an increased utilization of the available geometrical cross-section per winding, with respect to the RF skin and proximity effect issues. As such, a more even current flow distribution can be configured by the stranded winding, especially the first winding 402, across a cross-sectional area; without which, currents of the inner winding specifically can get pushed to just one surface (e.g., an inner surface towards the center side) with the remaining material being bottlenecked or having very little current flow. Thus, a plurality of N strands making-up/forming a winding configured in the inductor 400 can increase an effective cross-section area of the winding available for conduction of radio frequency (RF) currents, in response to the RFIC operating at an operating frequency rand (e.g., a Gigahertz range).

Figure 5:
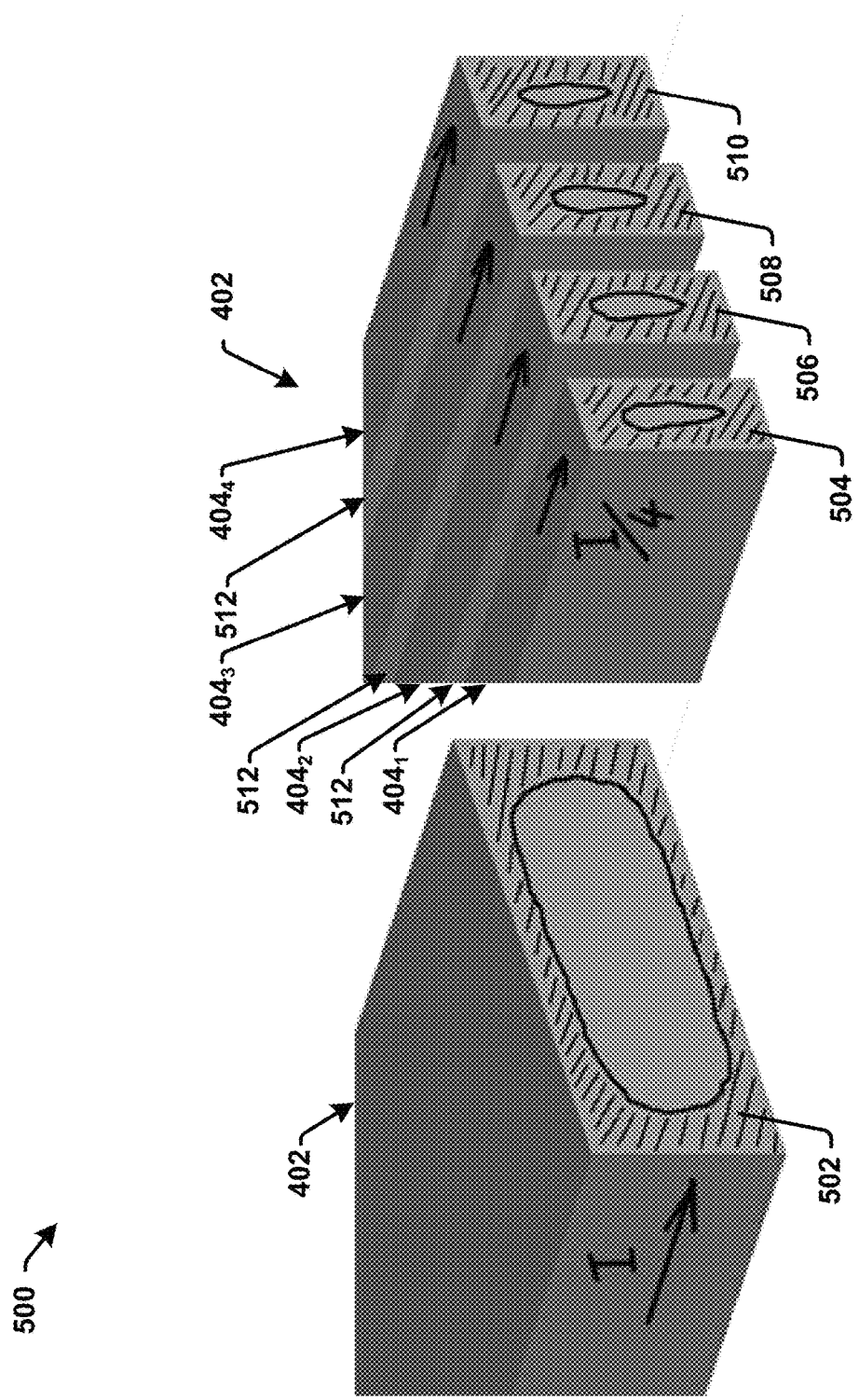
FIG. 5 is an example of a stranded and non-stranded winding in accordance with various aspects described.

Briefly referring to FIG. 5, illustrated is an example cross-section 500 of a winding as a solid winding 402 (e.g., solid metal/composite) and the winding 402 with strands $404_{1-4}$ according to various aspects herein. As part of a IC fabrication process, the solid winding 402 can be split into strands and spaced within the same width as the solid winding 402 on the left.

Despite whether the first winding 402 (or the second winding 410) comprises 2, 3, 4 or more strands, the width can be a same width of a given winding (e.g., 410 or 402) after being split into strands, so that each winding with strands is formed into strips with a minimum volume (or width) each, and then configured to fill the volume or width of the given winding with any number of a plurality of strands $404_{1-N}$, for example, as in the case of winding 402. The same can be true for the winding 410 as well. The strands $404_{1-N}$ are grouped and configured as a single winding 402, for example, that can connect to another winding (either as solid metal or another group of stripped conductor strands) as a group by the windings cross 408.

The cross-section 500 available for conduction of RF currents (I, and I/4) is marked in a hatched style in the hatched volume 502 of the solid winding 402, for example, and the hatched volumes 504-510 of the strands $404_{1-4}$ of the stranded winding 402. The width of each strand $404_1$ thru $404_4$ can be set or configured to be close to the admissible 'minimum width' value of the utilized IC technology, and the spacing 512 between each of the strands can be set to or configured with a respective 'minimum spacing'.

The conductor height of each winding 410 and 402 can be unchanged with respect to one another, as well as of any associated strands $412_{1-N}$ or $404_{1-N}$ being formed or split therein. In particular, the total width (maximum extension) of the bundle of strands $404_1$ thru $404_4$ on the right side can equal the width of the solid massive conductor 410 on the left side, with a similar current being provided at each solid winding 402 on the left and stranded winding 402 on the right. However, the stranded winding 402 on the right can induce an increase in an effective cross-section area of the first winding available for conduction of radio frequency (RF) currents in comparison to the solid right winding 402.

The centers of a winding 402 can be prone in general to increase in skin effect and can suffer more from a bottleneck in current flow, especially so with the solid winding 402. The strands $404_1$ thru $404_4$ on the stranded winding 402 to the right are configured to increase the available cross areas 504-510 for conduction of RF currents much more than the solid left winding 402. Thus, an existing inductor or transformer design can be revamped with such strands $412_{1-N}$ or $404_{1-N}$ (or 504-510) for lowered Ohmic losses, without having to change basic properties like total inductor area, number of turns, or inductance value.

In an aspect, for a selective revamping process—not all windings have to be split into N strands, some could be left unchanged and stay in massive (sold) shape as in the example 502 as discussed above. In case of a monolithic transformer, the coupling factor could essentially also stay unchanged.

An estimation for N strands can be given by the following representation: Original massive winding width=N*'min width'+(N−1)*'min spacing', Eqn (2), where N can be an integer from the set {2, 3, 4, 5, 6, . . . }.

A reason to choose a single strand's width very close to a 'minimum width' value of the IC Technology is that for most cases of interest, the RF skin depth value can be much less than the geometrical (massive) winding width value as one solid winding. The more the conductor width approaches the skin depth or an even smaller value, the less pronounced and detrimental the RF skin effect will be. This means, that even if this above technology-dependent choice of strand width is not optimum in a strict sense, the stranded winding at least significantly increases the effective conducting cross-section area compared to the winding 402 being one solid winding. This can also be the same with the winding 410 to some degree. Although, an example of an inner winding 402 being non-stranded has not been described, this does not exclude this possibility or option, and is also envisioned as an embodiment herein.

Referring back to FIG. 4, the inductor 400 can further comprise a number of twisting components 414 and 406. Along a winding with a full winding angle of 360 degrees, the number of twists or twisting components along the angular winding path can be represented by Eqn (3) as follows: A meaningful minimum number of twists (twistings/twisting components, etc.)=N−1, where N=number of strands in Eqn (3). For example, the first winding 402 can comprise three twisting components 406.

However, there could be case(s) at substantially high frequencies where a multiple of this number of twists could be utilized, such as by doubling, tripling, or other factor of the number of twistings. For example, in a case of N=4, three twistings/twisting components for the winding (half, full or partial) could be the minimum; alternatively, six, nine, twelve, or other integer/multiple of N could be utilized. This can be applied for a full winding (360 degrees in path), a half winding (180 degrees in path), or an arbitrary angular winding section that is less than a full winding (or winding). A trade-off can be made however by an increase in DC resistance value with each additional twisting component and an increase in volume current distribution or an effective cross-section area of the winding available for conduction of radio frequency (RF) currents.

In an aspect, the stranded outer-most winding 410 can comprise a number of twisting components at each half outer-most winding 410a and 410b that is equal to one less than the number of strands N for 180 degrees.

In one example, the inductor 400 can comprise a 0.6 nH inductor, with an operating frequency of 4 GHz, and Q being equal to 16.6. This can be an increased Q from about 14.7 without the stranded windings and the twisting components 414 and 406, respectively. The inner winding 402 and outer winding 410 can each comprise four strands each with a 1.8 micrometer width, "thick" copper utilized. In order to preserve the original winding width (e.g., as shown in the winding 410 of FIG. 3) without strands of about 10 micrometers, N=4 strands are utilized.

The twisting components 406, 414 can be configured to further reduce proximity field effects at the windings, and even more so with an inner winding being affected by an outer winding, for example.

In an aspect, the twisting components 406, 414 can be provided to connect to the strands of a winding at different locations along the angular winding path, and span across the strands at each location, as the group of strands (e.g., $404_{1-N}$) with or within intermediate strands between the outer-most strand and the inner-most strand. The twisting components 406, 414 are configured to slice or splice a first strand and another second strand at the location it is coupled to and join these strands together at each slicing or splicing by a connector/joining path, which is further detailed below at FIG. 6, for example.

Figure 6:
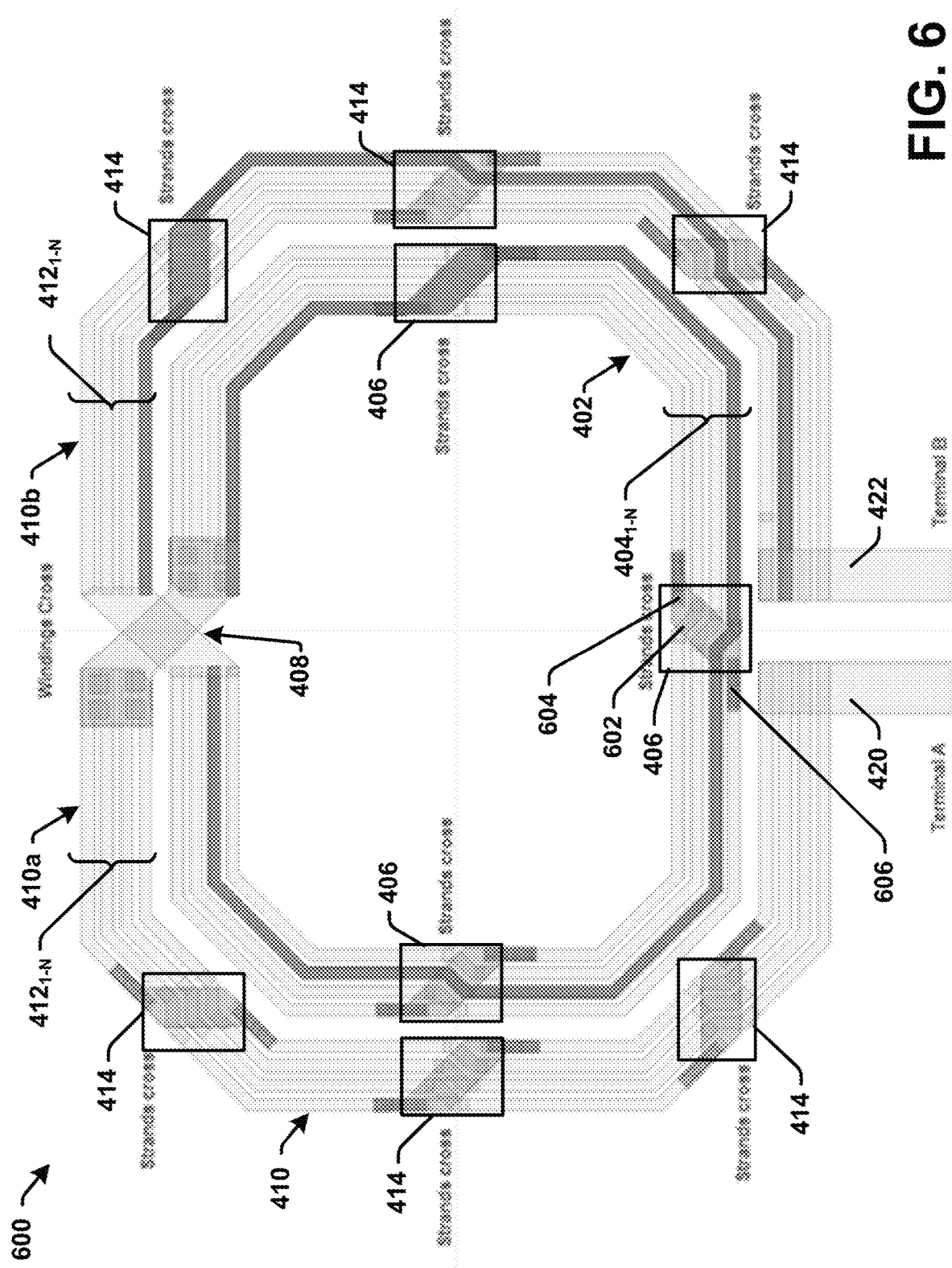
FIG. 6 illustrates example of an inductor in accordance with various aspects described.

Referring to FIG. 6, illustrated is another example inductor 600 similar to the inductor 400 according to various aspects further detailing twisting components 404, 416.

Here, each twisting components 414 or 406 can include a strand cross or strip path 602 joining one strand within a winding to another strand. The bottom-most twisting component 406 of the first winding 402 is detailed to exemplify the other structures and configurations of the other twisting components as well that are located radially along an angular path of each winding 410 and 406, which are substantially parallel and radially-symmetric with respect to one another as in FIG. 4 also.

Each twisting component 406 (as well as 414) can comprise a strand path or connecting strip 602 that joins a strand (e.g., an inner-most strand) at a connection 604 at a cut or splicing of the strand position and extends it to another strand (e.g., an outer-most strand) at a connection 606 as another spliced position or location thereat. The twisting components 414 or 406, in one example, can twist an inner-most strand of the plurality of strands to a position 606 of an outer-most strand of the plurality of strands along the first winding or the outer-most strand to a position 602 of the inner-most strand.

Additionally or alternatively, twisting components 414 or 406 can adjust another path of one or more intermediate strand that is between the outer-most strand and the inner-most strand toward a center path of the first winding.

Although the number of strands N can be two for a particular winding, in the illustrated example of FIG. 6 each twisting component 414 or 406 can thus span the strands 404, as well as over any intermediately located strands (e.g., $404_2$-$404_3$) there-between in order to alter the positions of the inner- and outer-most strands at positions 604 and 606, so that the outer-most strand is positioned as an intermediate strand, and the inner-most strand at 604 becomes an outer-most strand at 606 by position, for example.

In an aspect, the twisting component(s) 414 or 406 can be located at different locations along the angular path of each winding 410 or 402 based on the number of twisting components (e.g., see, Eqn. 3). Although the locations of the twisting components along each winding are illustrated symmetrically with respect to a same angle difference along the winding angular path radially, the twisting components can also be asymmetrically distributed with respect to one another.

As discussed above, the twisting components 406, 414 can be configured to reduce skin and proximity field effects within the inductor 400, or otherwise.

Figure 7:
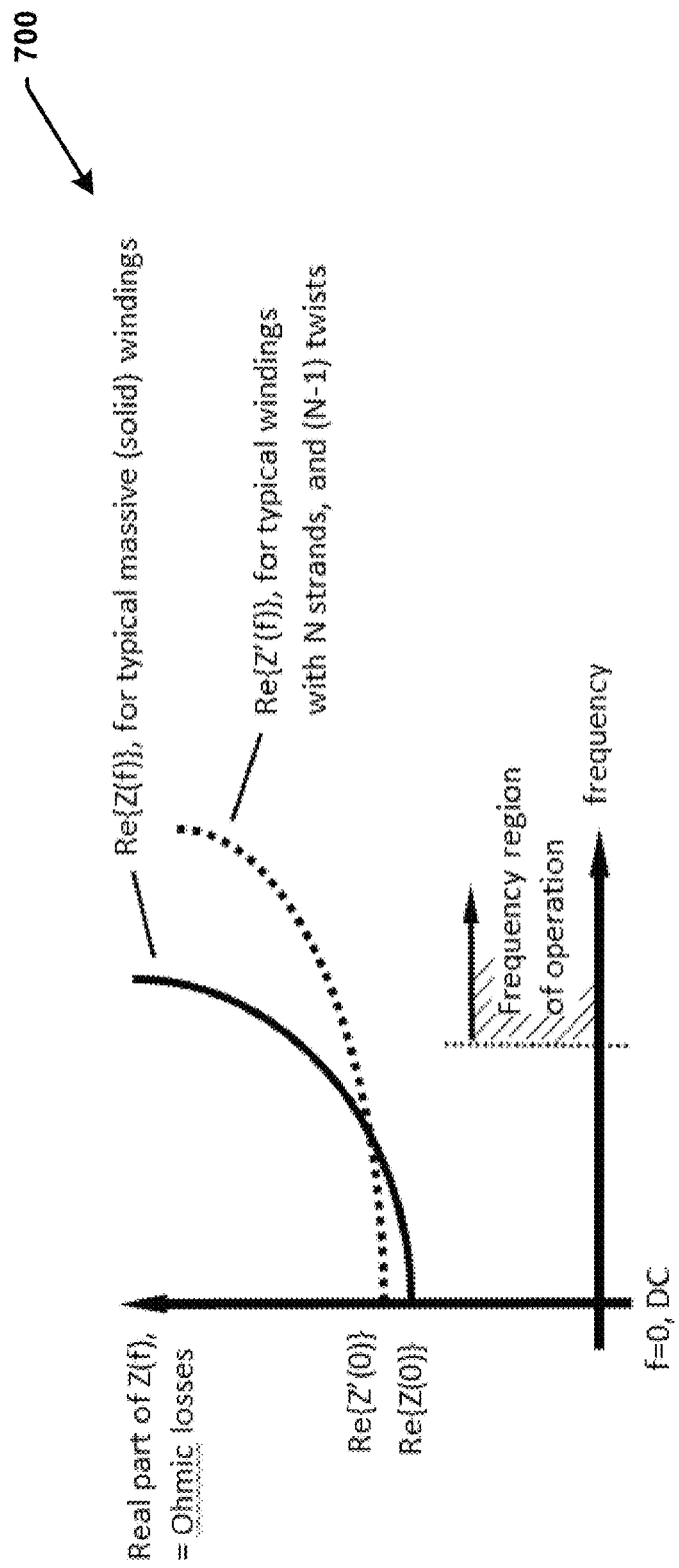
FIG. 7 is an example of a graph comparison of stranded and non-stranded windings in accordance with various aspects described.

Referring to FIG. 7, illustrated is an example graph 700 of the impact of RF skin and proximity effect in solid or massive winding shape compared to a winding that is stranded with N strands and N−1 twisting components in accordance with various aspects.

The graphed curves of graph 700 demonstrates that an inductor can have a figure of merit: the Q factor/value based on the Eqn. 1. Here, it is shown that the Q factor can be improved within higher operating frequencies than DC current at zero frequency, and be applicable with greater benefit in the Gigahertz range of operation, such as from 24/28/39/60/77 GHz, higher GHz, or lower GHz, especially for mmWave operating frequencies.

In particular, the twisting components and the stranded windings with a bundle of N strands for a winding (e.g., an inner-most winding, outer-most winding, both inner- and outer-most windings, or windings in-between or adjacent in a transformer as a primary or secondary inductor winding) can operate to decrease the detrimental impact of RF proximity effect, which forces the partial currents in the N strands to flow equally distributed.

The advantages for a Quality Factor increase of an inductor or transformer herein in an RFIC can be applicable to the following with example advantages: 1) digital controlled oscillator (DCO) Core Inductor: less area, less phase noise, less current spent for LO path, less area consumption for associated LO path, better EVM for receiver (Rx) or transmitter (Tx); 2) a low noise amplifier (LNA) Input Match Inductor: less Area, lower Noise Figure, less current consumption, more RX selectivity; 3) mmWave Rx/Tx inter-stage coupling transformer: less area, less insertion loss, more gain, less number of gain stages needed, less current consumption; or 4) Tx capacitor digital to analog converter (CDAC) Balun: less area, less insertion loss, more available Tx output power.

Figure 8:
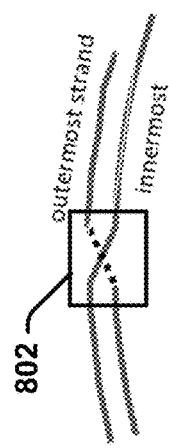
FIG. 8 is an example of twisting components for different strands in accordance with various aspects described.
Figure 8:
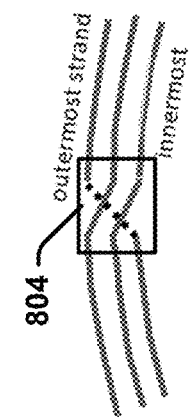
Figure 8:
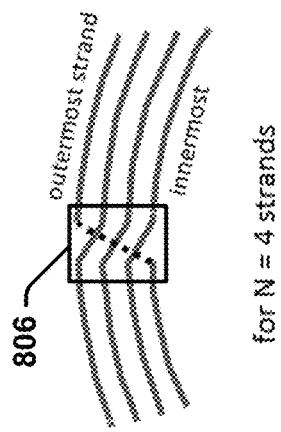

Referring to FIG. 8, illustrated are example twisting schemes 800 or aspects that can be utilized by one or more twisting components of various aspects herein. The twisting schemes 800 illustrate different twisting components 802 thru 806 that can represent different embodiments of twisting components 406, 414 or otherwise located at different locations along one or more windings of an inductor. The dotted line represents a connector or joining portion connecting two cuts or spliced strands from the outer-most strand to the inner-most strand, or vice versa, proximate to one another and offset within a location of the twisting component, respectively. The other strands can then be adjusted inward without spanning or hopping over other strands as with the dotted connect of the twisting component(s).

In particular, at a twist, the innermost strand's path moves to the outermost strand's former position, the other strands' paths are adjusted towards the center of the inductor. The twisting components or schemes can also applicable for Cases N strands>4. This scheme can also be applied for half-windings, or even shorter sections of a winding that are less than a half or in between a half winding of about 180 degrees and a full winding at 360 degrees.

As also in the example of FIG. 4, following the path of the inner winding along 360 degrees of angle, a chosen strand changes its position in this manner by the applied three twists. This means that under the assumption of a more or less radial-symmetric magnetic field, all strands are impacted all equally by this electromagnetic field. The twisting schemes/components can then also configure an equal current distribution among the N strands, and a more effective utilization of the available cross-section for conduction of RF currents. Finally, this results in lowered Ohmic losses and a higher Quality Factor, compared to the original design of a solid winding without twisting components or configured to a stranded winding of the inductor.

Figure 9:
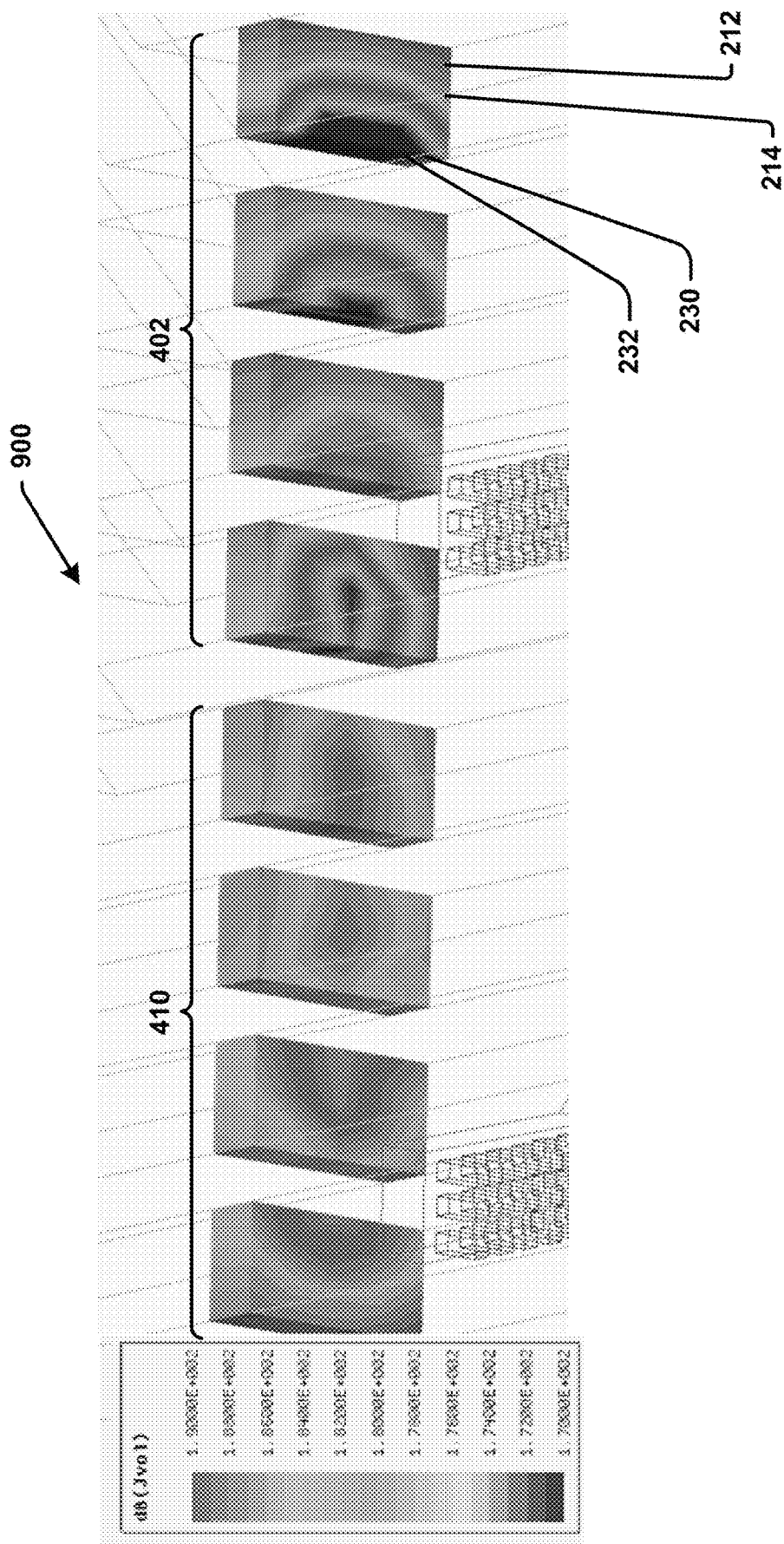
FIG. 9 is an example of an electromagnetic (EM) field distribution within inductor windings in accordance with various aspects described.

Referring to FIG. 9, illustrated is an example electromagnetic field distribution of the inductor component 400 of FIG. 4 in accord with various aspects. An electromagnetic field distribution (Jvol) 900 is illustrated along strands 404$_{1-N}$ of an inner (or inner-most) winding 402, and strands 412$_{1-N}$ with cross sectional areas associated with current flow along the field gradient. As illustrated, field concentrations with highest current flow can be seen at 212 and 214, and lowest at 232 and 230 with very minimal to no current flow (as non-conducting areas), for example. Across all strands of both windings 402 and 410 a more uniform distribution of current can be seen as a function of the windings being configured as stranded windings, and twisting components across various locations along each winding. Thus, an overall increase in the Q factor results. The twisting components and strands together can enable a substantially equal current distribution among the plurality of strands of a winding. Additionally, the twisting components and stranded windings increase an effective cross-section area of the first winding available for conduction of radio frequency (RF) currents, in response to the radio frequency integrated circuit operating in an operating frequency range.

Figure 10:
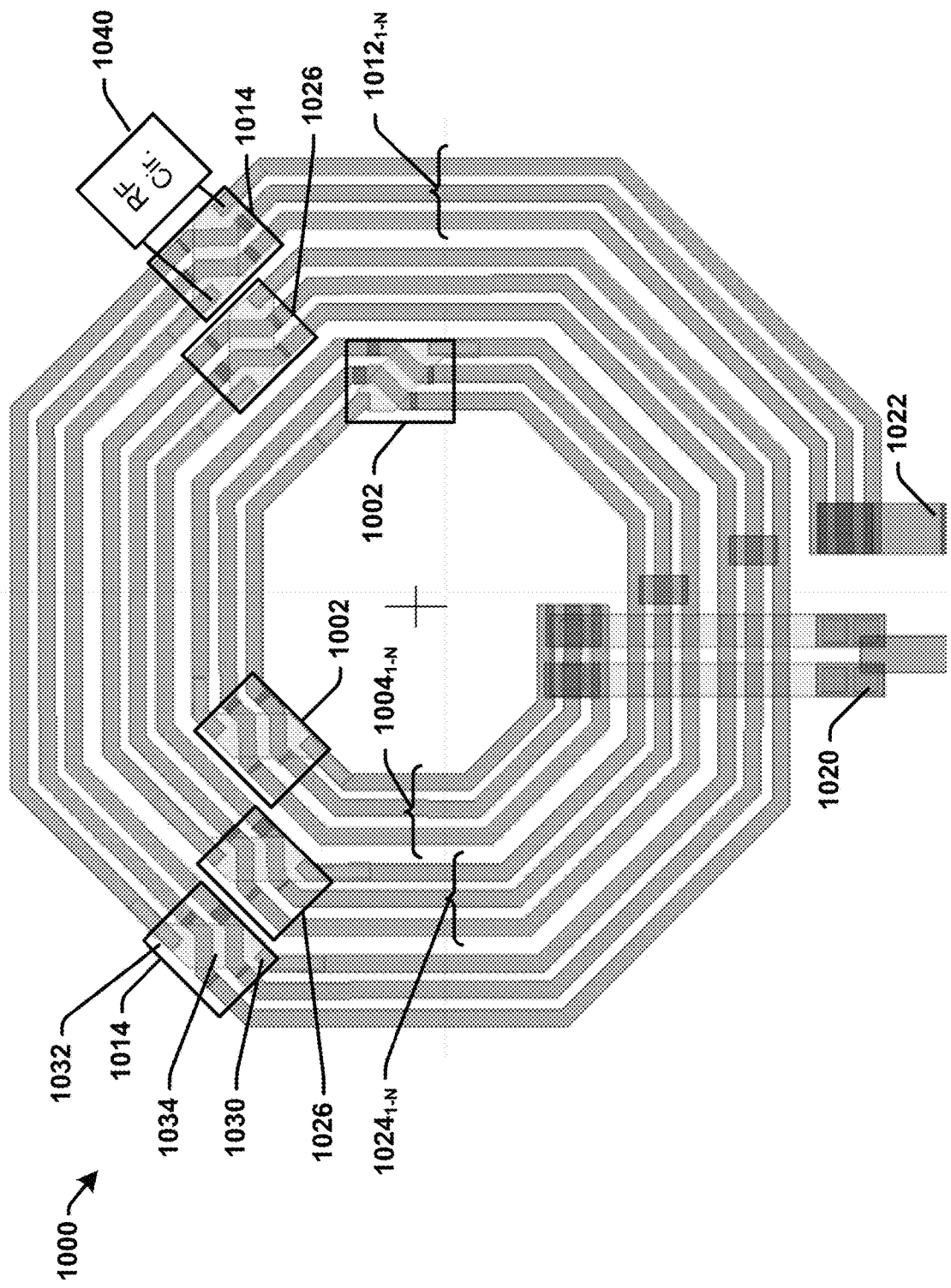
FIG. 10 illustrates another example of an inductor in accordance with various aspects described.

Referring to FIG. 10, illustrated is another example of an inductor in accord with various aspects. The inductor component 1000 comprises windings that can be radially symmetrical along an angular path that is substantially concentric to one another around a center. The inductor component 100 comprises an outer-most winding 1012 spliced into strands 1012$_{1-N}$ and further configured with two twisting components 1014 along different locations coupled to the winding. An inner-most winding 1004 is also configured with strands 1004$_{1-N}$ running parallel along an angular path of the winding to one another and spaced evenly apart along the width of the winding. An intermediate or additional winding 1024 running about 360 degrees between the outer-most winding 1012 and the inner-most winding 1004 can also comprise a plurality of N strands (e.g., three) having two (N−1) twisting components 1026 coupled thereto and spanning the strands 1024$_{1-N}$. Although full windings are shown, as running about 360 degrees around a center point, other windings are also envisioned that can include additional winding portions running less than 360 degrees with a full winding.

Terminals 1020 couples to an end of the inner-most winding 1004, while terminal 1022 couples to another end of the outer-most winding 1012 as an example. However, any number of possible configurations or designs could be envisioned as one of ordinary skill in the art could appreciate.

Each winding can be spaced further apart than the strands within any particular winding as illustrated, for example, but not necessarily. Each group of strands within a winding can be about evenly spaced from one another and comprise the width of the winding.

Similar to other twisting components described herein, the twisting components 1002, 1014 and 1026 can span the strands within a winding associated with it as well as be located symmetrically with respect to one another within their associated winding or one another overall. For example, at every number of degrees within an angular/radial path associated with the winding a twisting component can be coupled to the strands of the winding. Alternatively, a winding can be asymmetrically located along the winding path. The asymmetrical location, for example, can based on an angular field gradient, in which the angular field gradient can be associated with an adjacent or surrounding winding.

Each twisting component 1002, 1014 and 1026 can comprise at least two connection points 1030 and 1032 at the different locations with a connector or connecting path 1034 composed of similar or same material as the winding strands, or a different composition, in which the path 1034 joins at an inner-most strand (e.g., at 1030) of the winding to an outer-most strand (e.g., at 1030) of the same winding in order to connect and twist the two into different positions. The inner-most strand and the outer-most strand are spliced or cut at the joining points/ends and joined at these connection points 1030 and 1032, for example. The same aspects apply similarly so to the other twisting components 1002, 1014, and 1026 also. Further, the other strands within the location of each twisting component can also be adjusted toward inward positions without interruption or cutting of the strand otherwise.

In one example, the inductor 1000 can comprise a 0.6 nH inductor with an example operating frequency range of about 3.3 GHz to about 6 GHz. At 3.3. GHz the Q factor can be a value of about 12.39, while at 6 GHz be about 15.4, for example. The width of each winding, whether solid, partially solid, or strand as illustrated can be about 1.8 micrometers "minimum width" and be composed of "thick" copper, while the connector material or strands cross 1034 joining the inner- and outer-most strands within a winding at a given location be composed of "thin" copper layer, which is thinner than the thick copper, for example. Other metals could also be combined or different for the windings and the cross 1034 or connector could be of a same thickness or not as the winding. The strand cross/connector 1034 could also connect each strand at a via (not shown) or within an aluminum layer or different metal connection at the strands, for example.

In another aspect, one or more of the twisting components can further comprises the two connection points 1030 and 1032 at the different locations for a path twisting the inner-most strand to a position of the outer-most strand, and at least one additional connection point to an extra path there-between or at another point of any one of the strands.

For example, an RF circuitry 1040 can be coupled at the connection areas of connections 1030 and 1032 or elsewhere at the twisting component. The RF circuitry can include any number of circuit components, coupled in parallel or series, such as a capacitor, another inductor as a secondary coil, amplifier, or other circuitry without limitation of any one component or device.

In another aspect, rather than a strand crossing 1034 at a twisting component (e.g., 1014), the RF circuitry or any element/component thereof could join the strands (e.g., from the inner-most strand to the outer-most strand, or otherwise) with or without extra paths (e.g., capacitor(s), resistor(s), inductor(s), transformer(s), or the like) serving or not as a reactance also forming a weaker connection thereto physically or electromagnetically. In addition, or alternatively, the inductor(s) herein can be formed as one or more primary or secondary windings with another primary or secondary winding to form a transformer or mutually coupled EMF circuit like a transformer, for example.

Figure 11:
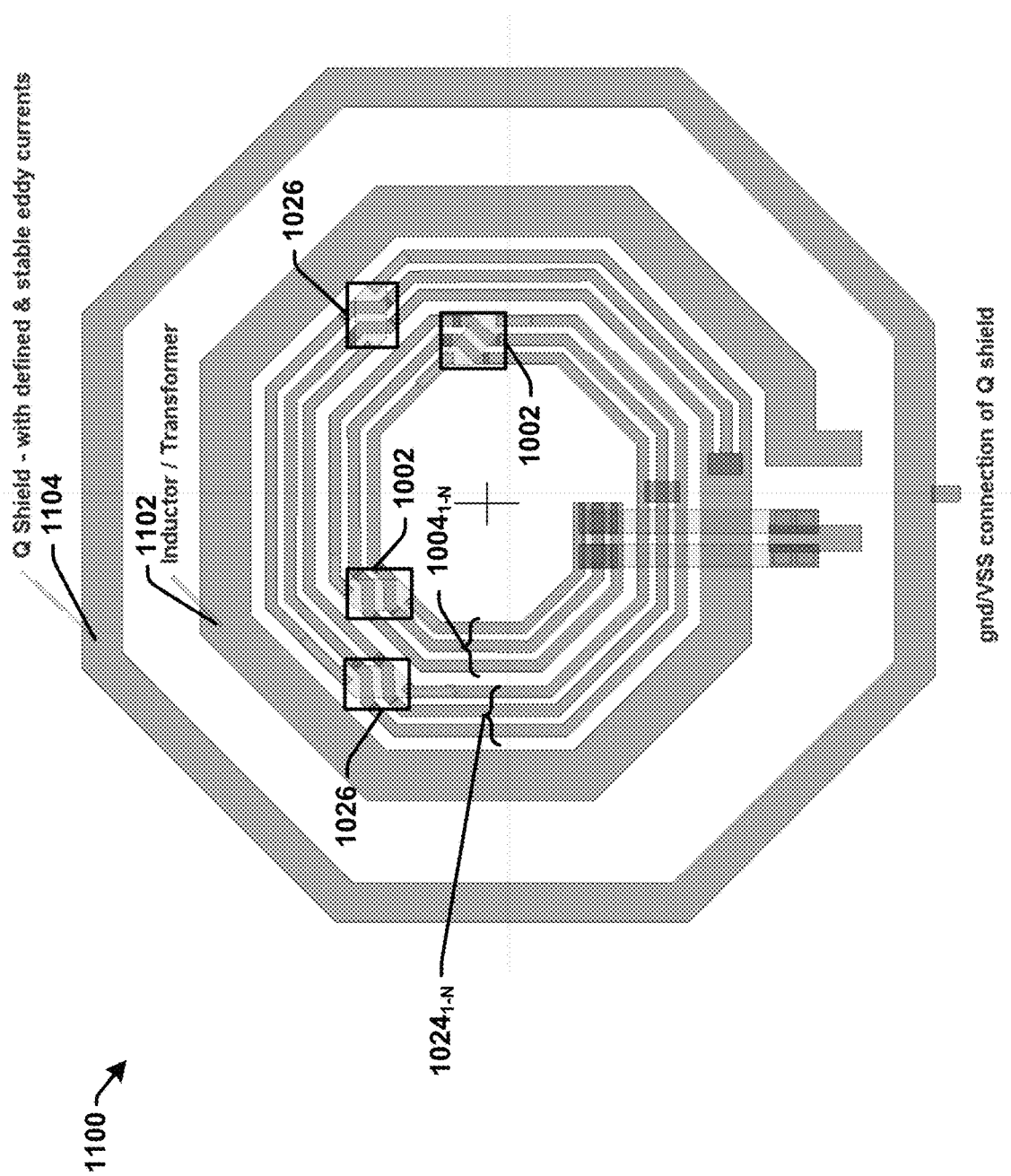
FIG. 11 illustrates an example of an inductor with a Q shield in accordance with various aspects described.

Referring to FIG. 11, illustrated is an example inductor system 1100 in accord with various aspects. The inductor 1100 comprises similar components as the inductor 1000 of FIG. 10; however, the outer-most winding 1102 can be a solid metal winding of same, similar, or different width along an angular path as the other windings 1104 and 1024. Although the outer-most winding is solid, it would be stranded and other windings 1004, or 1024 be solid without twisting components as well.

The inductor system 1100 further comprises a Q shield 1104, also referred to as a closed-loop guard ring or a closed-loop ground ring, for a monolithic inductor. The Q-shield 1104 can improve isolation to surrounding or external structures or components, as eddy currents in the ring can partially cancel emerging field of inductor/transformer.

Figure 12:
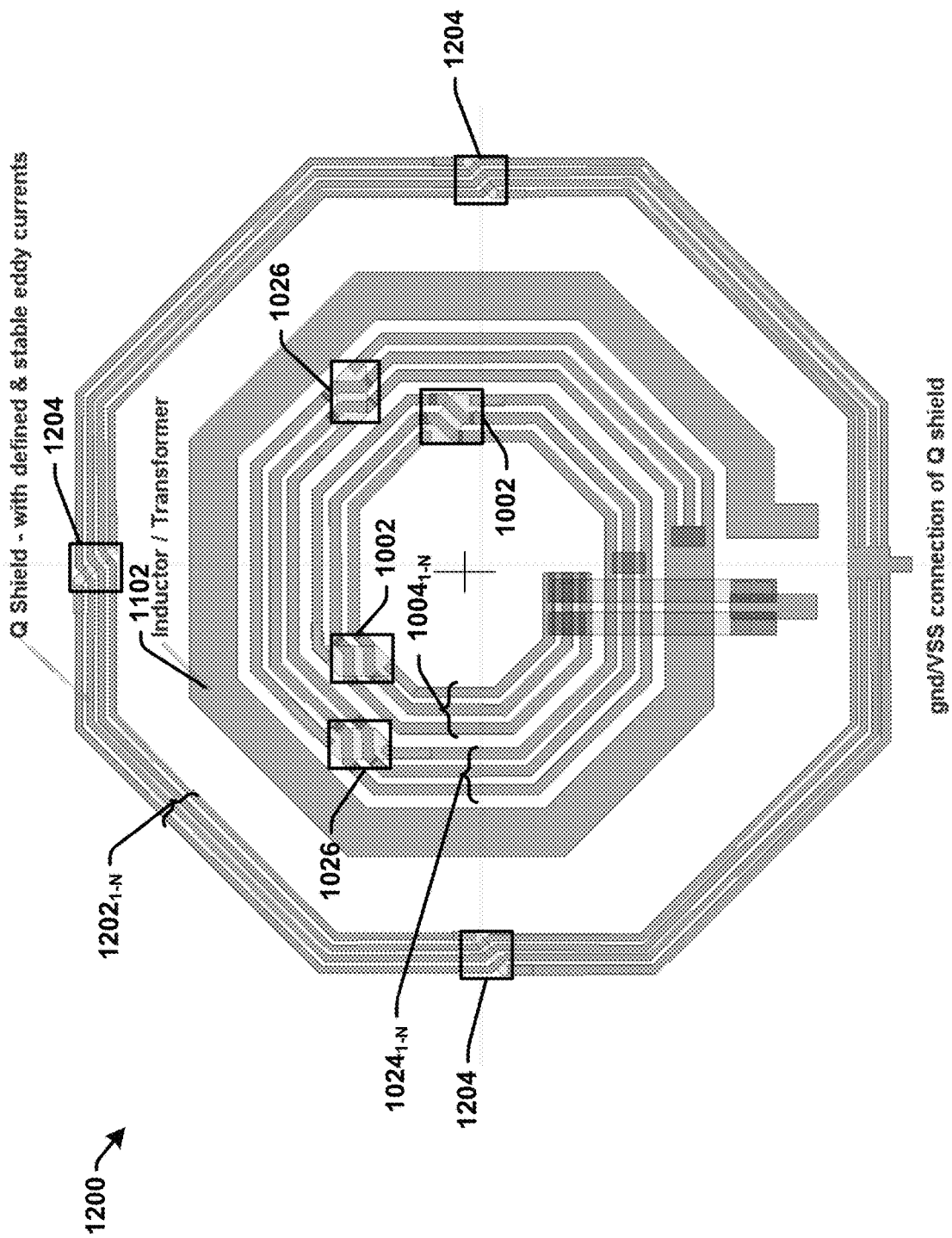
FIG. 12 illustrates another example of an inductor with a Q shield in accordance with various aspects described.

Referring to FIG. 12, illustrated is another example inductor system in accordance with various aspects. The inductor system 1200 is similar as 11 of FIG. 11, but the Q shield is stranded with strands $1202_{1-N}$ having twisting components 1204 along the radial path of the Q shield. As a result of the inductor having a more uniform distribution of current throughout the windings, and increasing the effective cross-section area of the first winding available for conduction at an operating frequency range by being stranded and comprising twisting components, the Q shield can also benefit. For example, less material would be needed to effect a Q shield or configure it around such inductor 1100. As such, having a stranded Q shield and twisting components throughout adjacent to or electromagnetically coupled to the inductor can further enable cost and efficiency advantages of an RFIC, for example. As with other twisting components and windings, the number of N strands can vary in number and is not limited to any particular example herein, in which N can be an integer of two or more.

Figure 13:
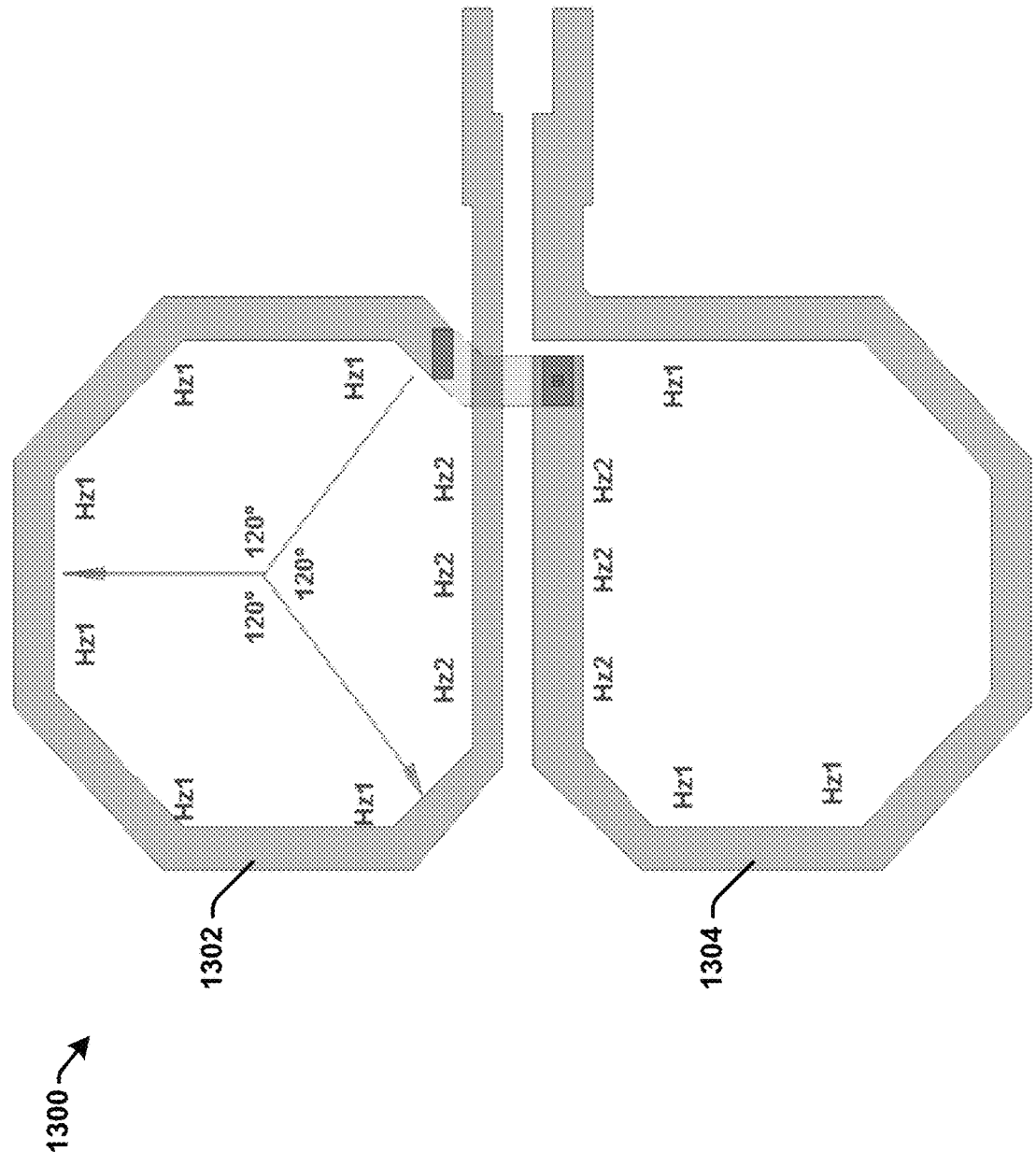
FIG. 13 illustrates an example of an inductor and twisting component locating scheme in accordance with various aspects described.

Referring to FIG. 13, illustrated is an example situation for configuring a locating scheme for locating or placing twisting components with strands crossings along a particular winding. For example, an inductor 1300 is illustrated with a primary inductor 1302 as one winding and a secondary inductor 1304 as another winding, together with an FIG. 8 shape, in which the series windings are not necessarily placed concentrically. If the number of strands within any one winding of the inductor 1302 or 1304 (e.g., N=3) is not optimum as the angular electric field |Hz1| is not equal to |Hz2|, then a correction of locations along the path of the twisting components can be configured to maintain or maximize the advantages of having an increase in an effective cross-section area in a winding that is available for conduction, as well as a substantially equal current distribution across strands of the winding. In particular, as shown in FIG. 13 |Hz1| is not equal to |Hz2| because all along the inner perimeter of the upper winding 1302 is an angular gradient due to the parallel winding section of the other adjacent winding 1304.

Figure 14:
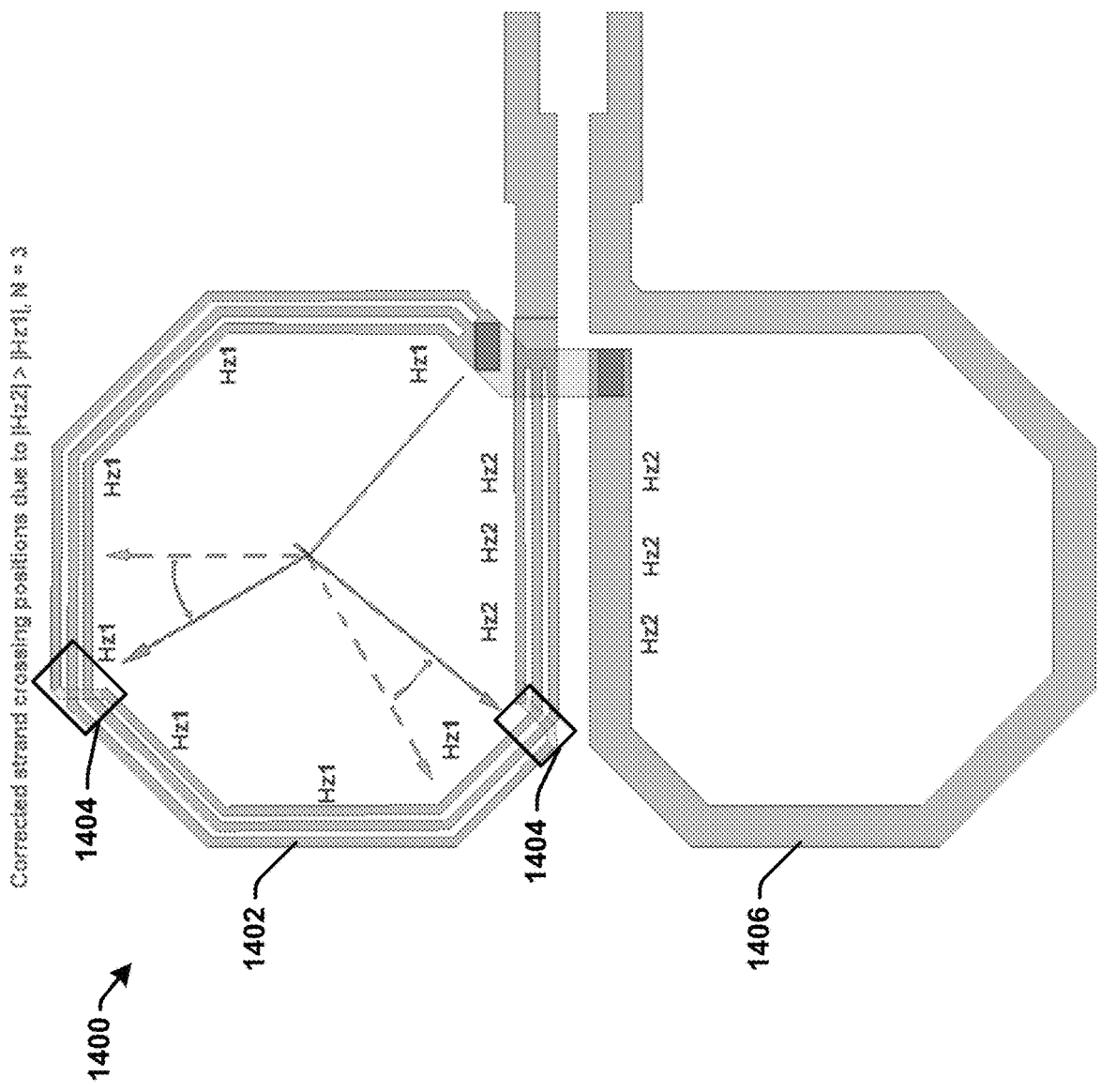
FIG. 14 illustrates another example of an inductor and twisting component locating scheme in accordance with various aspects described.

Referring to FIG. 14, illustrated an example locating scheme for locating or placing twisting components with strands crossings along a particular winding. An inductor 1400 is illustrated with a primary inductor 1302 and a secondary inductor 1406 as first and second windings that are not necessarily placed concentrically. Instead of having twisting components at every 120 degrees, as one embodiment, the twisting components 1404 can be shifted at an angle more than just adjusting a position as result of a slightly shifted center at each winding surrounding an inner winding, as in the FIG. 10 and the windings 1002, 1012, 1024, for example.

The twisting components (e.g., two in number for N=3) can be distributed across the winding to account for or mitigate the effects of an angular gradient detected. The number of twisting components can equal N strands minus one. Instead of locating a twisting component at a uniform 120 degrees from a start point or terminal connection, the twisting components 1404 can be shifted to maximize effect and reduce the angular gradient, or compensate.

In the example of FIG. 14, the upper winding is stranded and the lower winding is solid, but the opposite could also be envisioned, with the lower stranded with twisting components there-along, or both stranded with twisting components along a winding. Either the upper or lower winding, or both could also comprise more than one winding, or a partial winding according to aspects herein.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 15:
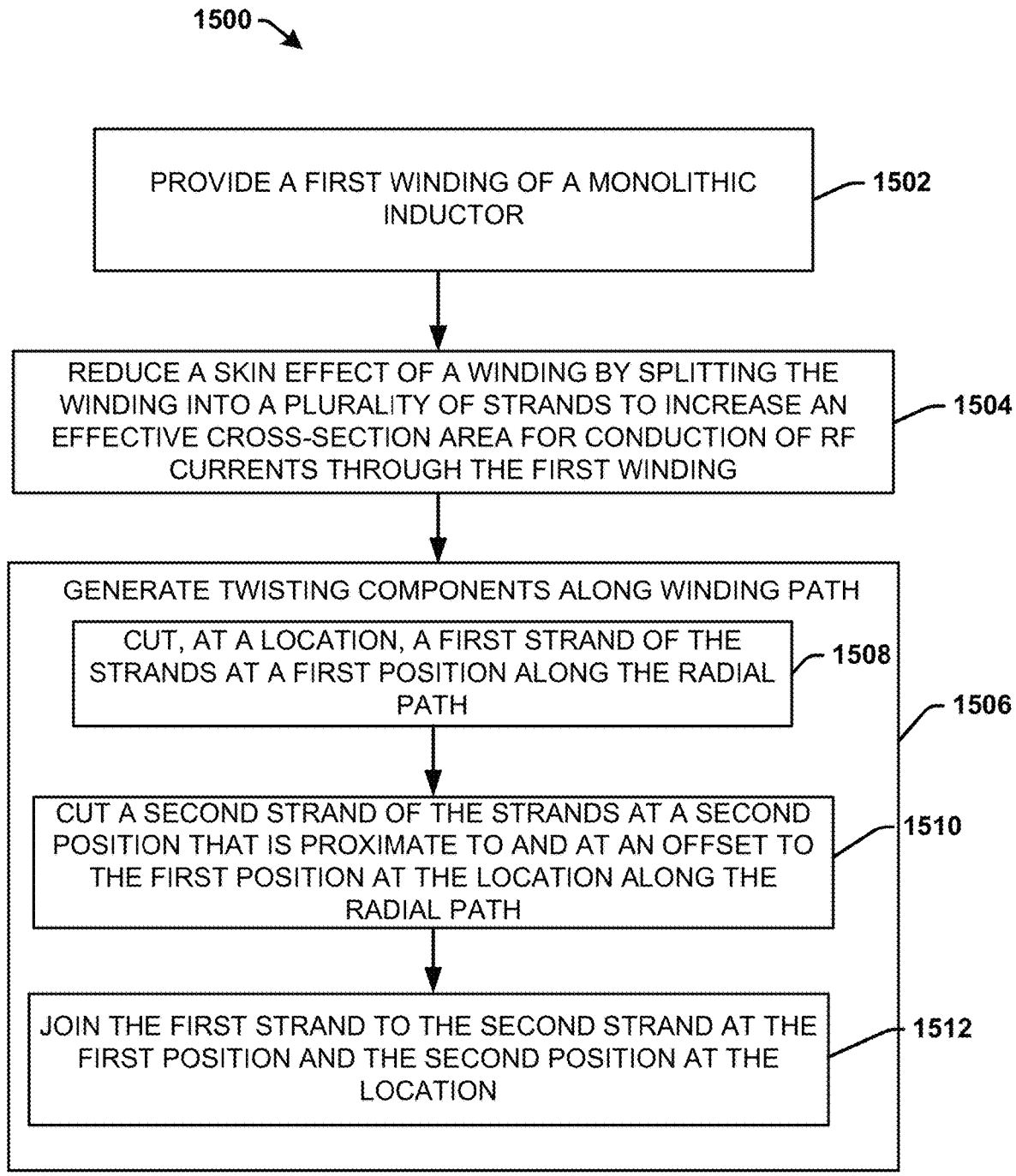
FIG. 15 is a flow diagram illustrating a method of an inductor according to various aspects described.

Referring to FIG. 15, illustrated is a process flow 1500 for forming an inductor (e.g., a monolithic inductor) of an RFIC as described herein. The method initiates at 1502 with providing a first winding of a monolithic inductor such on an IC board/device in a back end of line semiconductor fabrication stage.

At 1504, the process flow 1500 further comprising reducing a skin effect of a winding (e.g., a first winding) by splitting the winding into a plurality of strands to increase an effective cross-section area for conduction of radio frequency (RF) currents through the first winding. This can be in response to the radio frequency integrated circuit operating at an operating frequency range of a Gigahertz frequency range, for example.

At 1506, a plurality of twisting components are formed at different locations along a radial path of the winding. This can further comprising at 1508 cutting, at a location, a first strand of the plurality of strands at a first position along the radial path.

At 1510, the process flow includes cutting a second strand of the plurality of strands at a second position that is proximate to and at an offset to the first position at the location along the radial path.

At 1512, the process flow can include joining the first strand to the second strand at the first position and the second position at the location.

In one embodiment, the process flow can also include providing a second winding that is substantially radially-symmetric to the first winding; and configuring, via the plurality of twisting components, a substantially equal current distribution among the plurality of strands of the first winding.

In another embodiment, the process flow can include any one of the aspects or embodiments discussed herein. For example, forming the twisting components can include spanning across the first strand and the second strand of the plurality of strands, wherein the first strand comprises an inner-most strand and the second strand comprises an outer-most strand of the plurality of strands.

Other aspects, for example, can also include providing a Q-shield or re-positioning the twisting components based on an angular field gradient detected at another winding.

Figure 16:
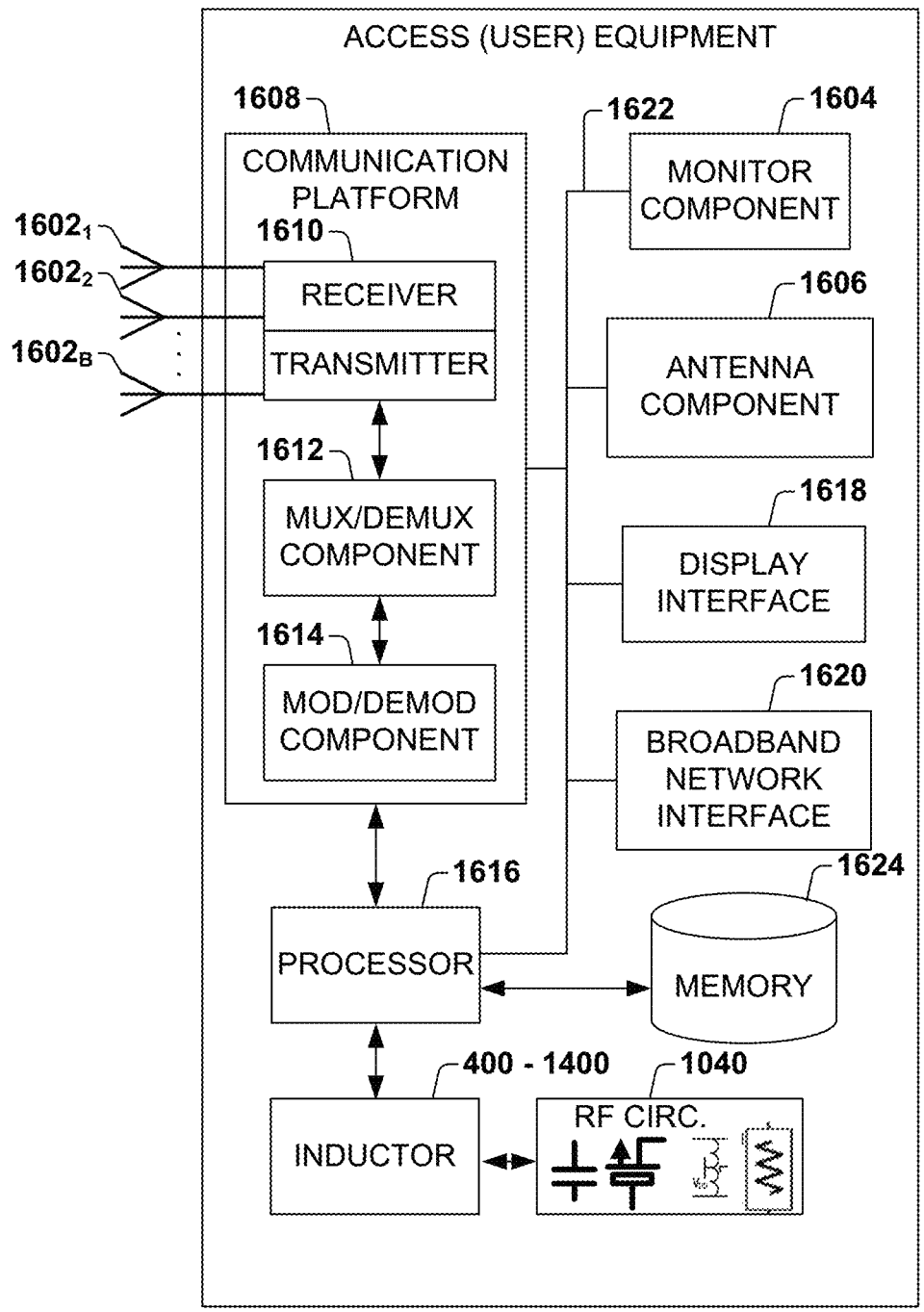
FIG. 16 is another example architecture of a user (access) equipment for implementing various aspects described.

To provide further context for various aspects of the disclosed subject matter, FIG. 16 illustrates a block diagram of an embodiment of access (user) equipment related to access of a network (e.g., base station, wireless access point, femtocell access point, and so forth) that can enable and/or exploit features or aspects disclosed herein as related to inductor or transformer configurations and components with strands within the windings and twisting components along those stranded windings.

Access equipment, UE and/or software related to access of a network can receive and transmit signal(s) from and to wireless devices, wireless ports, wireless routers, etc. through segments $1602_1$-$1602_B$ (B is a positive integer). Segments $1602_1$-$1602_B$ can be internal and/or external to access equipment and/or software related to access of a network, and can be controlled by a monitor component 1604 and an antenna component 1606. Monitor component 1604 and antenna component 1606 can couple to communication platform 1608, which can include electronic components and associated circuitry that provide for processing and manipulation of received signal(s) and other signal(s) to be transmitted.

In an aspect, communication platform 1608 includes a receiver/transmitter 1610 that can convert analog signals to digital signals upon reception of the analog signals, and can convert digital signals to analog signals upon transmission. In addition, receiver/transmitter 1610 can divide a single data stream into multiple, parallel data streams, or perform the reciprocal operation. Coupled to receiver/transmitter 1610 can be a multiplexer/demultiplexer 1612 that can facilitate manipulation of signals in time and frequency space. Multiplexer/demultiplexer 1612 can multiplex information (data/traffic and control/signaling) according to various multiplexing schemes such as time division multiplexing, frequency division multiplexing, orthogonal frequency division multiplexing, code division multiplexing, space division multiplexing. In addition, multiplexer/demultiplexer component 1612 can scramble and spread information (e.g., codes, according to substantially any code known in the art, such as Hadamard-Walsh codes, Baker codes, Kasami codes, polyphase codes, and so forth).

A modulator/demodulator 1614 is also a part of communication platform 1608, and can modulate information according to multiple modulation techniques, such as frequency modulation, amplitude modulation (e.g., M-ary quadrature amplitude modulation, with M a positive integer); phase-shift keying; and so forth).

Access equipment and/or software related to access of a network also includes a processor 1616 configured to confer, at least in part, functionality to substantially any electronic component in access equipment and/or software. In particular, processor 1616 can facilitate configuration of access equipment and/or software through, for example, monitor component 1604, antenna component 1606, and one or more components therein. Additionally, access equipment and/or software can include display interface 1618, which can display functions that control functionality of access equipment and/or software or reveal operation conditions thereof. In addition, display interface 1618 can include a screen to convey information to an end user. In an aspect, display interface 1618 can be a liquid crystal display, a plasma panel, a monolithic thin-film based electrochromic display, and so on. Moreover, display interface 1618 can include a component (e.g., speaker) that facilitates communication of aural indicia, which can also be employed in connection with messages that convey operational instructions to an end user. Display interface 1618 can also facilitate data entry (e.g., through a linked keypad or through touch gestures), which can cause access equipment and/or software to receive external commands (e.g., restart operation).

Broadband network interface 1620 facilitates connection of access equipment and/or software to a service provider network (not shown) that can include one or more cellular technologies (e.g., third generation partnership project universal mobile telecommunication system, global system for mobile communication, and so on) through backhaul link(s) (not shown), which enable incoming and outgoing data flow. Broadband network interface 1620 can be internal or external to access equipment and/or software and can utilize display interface 1618 for end-user interaction and status information delivery.

Processor 1616 can be functionally connected to communication platform 1608 and can facilitate operations on data (e.g., symbols, bits, or chips) for multiplexing/demultiplexing, such as effecting direct and inverse fast Fourier transforms, selection of modulation rates, selection of data packet formats, inter-packet times, and so on. Moreover, processor 1616 can be functionally connected, through data, system, or an address bus 1622, to display interface 1618 and broadband network interface 1620, to confer, at least in part, functionality to each of such components.

Any one or more of the inductors 400-1400 herein can be operably coupled to the processor 1616 or other component as well as to RF circuitry 1040. As stated above, RF circuitry 1040 can comprise one or more circuit elements such as, for example, another inductor to form a transformer. Alternatively, or additionally, the RF circuitry 1040 can comprise a capacitor as well as any other circuit component (e.g., resistors, filter, amplifier, transistor, circuitry, etc.) that can function to regulate voltage or provide a matching impedance, for example, with the inductor component(s) or stranded windings with twistings/twisting components as described herein.

In access equipment and/or software memory 1624 can retain location and/or coverage area (e.g., macro sector, identifier(s)) access list(s) that authorize access to wireless coverage through access equipment and/or software sector intelligence that can include ranking of coverage areas in the wireless environment of access equipment and/or software, radio link quality and strength associated therewith, or the like. Memory 1624 also can store data structures, code instructions and program modules, system or device information, code sequences for scrambling, spreading and pilot transmission, access point configuration, and so on. Processor 1616 can be coupled (e.g., through a memory bus), to memory 1624 in order to store and retrieve information used to operate and/or confer functionality to the components, platform, and interface that reside within access equipment and/or software.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, nonvolatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

A first example can be an apparatus of a monolithic inductor of a radio frequency integrated circuit comprising: a first winding comprising a plurality of strands spaced apart from one another with a spacing; a second winding substantially radially-symmetric to the first winding for generating a radially-symmetric magnetic field; and a plurality of twistings, located at different locations along the first winding, configured to couple to the first winding at the different locations, and span across the plurality of strands of the first winding at the different locations.

A second example includes the subject matter of the first example, wherein a twisting component of the plurality of twistings is configured to cross-couple a first strand of the plurality of strands with a second strand of the plurality of strands at the different locations along the first winding.

A third example includes the subject matter of the any one or more of the first example thru the second example, wherein the plurality of twistings is configured to enable a substantially equal current distribution among the plurality of strands of the first winding.

A fourth example includes the subject matter of any one or more of the first example thru the third example, wherein the plurality of strands are configured to increase an effective cross-section area of the first winding available for conduction of radio frequency (RF) currents, in response to the radio frequency integrated circuit operating at a frequency equal to or greater than one Gigahertz.

A fifth example includes the subject matter of any one or more of the first example thru the fourth example, wherein the second winding comprises a solid width that is about equal to a width of the first winding.

A sixth example includes the subject matter of any one or more of the first example thru the fifth example, wherein the plurality of strands comprises spacings between pairs of strands that are about equal to one another.

A seventh example includes the subject matter of any one or more of the first example thru the sixth example, wherein a twisting component of the plurality of twistings is configured to increase a Quality (Q) factor of the first winding at an operating frequency range of the radio frequency integrated circuit.

An eighth example includes the subject matter of any one or more of the first example thru the seventh example, wherein a twisting component of the plurality of twistings comprises a path that twists an inner-most strand of the plurality of strands to a position of an outer-most strand of the plurality of strands along the first winding, or the outer-most strand to a position of the inner-most strand.

A ninth example includes the subject matter of any one or more of the first example thru the seventh example, wherein a twisting component of the plurality of twistings comprises an adjustment of at least one strand of the plurality of strands to a different position within the first winding extending about parallel between a first strand and a second strand of the plurality of strands in an angular path.

A tenth example includes the subject matter of any one or more of the first example thru the ninth example, wherein the different locations comprise one less in number along the first winding than the plurality of strands in the first winding.

A eleventh example includes the subject matter of any one or more of the first example thru the tenth example, wherein the plurality of twistings are asymmetrically spaced, or symmetrically spaced, along an angular path of the first winding around a center point based on an angular field gradient.

A twelfth example can be a system of an inductor of a radio frequency integrated circuit comprising: a monolithic inductor comprising a plurality of inductor windings, wherein the plurality of inductor windings comprises at least one first winding and at least one second winding, wherein the at least one first winding comprises a number of N strands that are split from one another and spaced apart within the first winding, wherein N comprises an integer equal to, or greater than, two; and a plurality of twisting components, at different locations along the at least one first winding, configured to span across the a number of N strands of the at least one first inner winding at the different locations.

A thirteenth example includes the subject matter of the twelfth example, wherein inductor windings of the plurality of inductor windings are radially-symmetric to one another to generate a radially-symmetric magnetic field at an operating frequency range of the radio frequency integrated circuit, and comprise a same radial center.

A fourteenth example includes the subject matter of any one or more of the twelfth example thru the thirteenth example, further comprising: a transformer comprising the monolithic inductor as a primary inductor with the plurality of twisting components at the different locations of the at least one first winding, and a second monolithic inductor as a secondary inductor arranged substantially concentrically on a plane with respect to the monolithic inductor and configured to electromagnetically couple to, or mutually resonate with the primary inductor.

A fifteenth example includes the subject matter of any one or more of the twelfth example thru the fourteenth example, further comprising: a Q-shield configured to surround the monolithic inductor and isolate the monolithic inductor with the plurality of twisting components from outside interference fields, wherein the Q-shield comprises a solid strand, or a different plurality of strands with a different plurality of twisting components at locations along a radial path of the different plurality of strands.

A sixteenth example includes the subject matter of any one or more of the twelfth example thru the fifteenth example, wherein the at least one second winding comprises a solid metal winding including a width that is about equal to a width dimension of the at least one first winding, or a plurality of strands spaced apart from one another along the width dimension of the at least one second winding.

A seventeenth example includes the subject matter of any one or more of the twelfth example thru the sixteenth example, wherein the plurality of twisting components are configured to cross-couple an inner-most strand of the number of N strands with an outer-most strand of the number of N strands at the different locations along the at least one first winding, wherein the different locations comprise symmetrical, or asymmetrical positions, with respect to one another along a radial path of the at least one first winding based on an angular field gradient at the at least one second winding.

An eighteenth example includes the subject matter of any one or more of the twelfth example thru the seventeenth example, wherein the plurality of twisting components further comprises at least two connection points at the different locations for a path twisting the inner-most strand to a position of the outer-most strand, and at least one additional connection point to an extra path.

A nineteenth example includes the subject matter of any one or more of the twelfth example thru the eighteenth example, further comprising one or more winding crossings coupling one or more strands of the number of N strands between the inner-most strand and the outer-most strand of the at least one first winding with strands of the at least one second winding, wherein the one or more winding crossing comprise less strands than the number of N strands.

A twentieth example can be a method of forming a monolithic inductor for a radio frequency integrated circuit comprising: providing a first winding of the monolithic inductor; reducing a skin effect of the first winding by splitting the first winding into a plurality of strands to increase an effective cross-section area available for conduction of radio frequency (RF) currents through the first winding, in response to the radio frequency integrated circuit operating at an operating frequency range of a Gigahertz frequency range; forming a plurality of twistings at different locations along a radial path of the first winding comprising: cutting, at a location, a first strand of the plurality of strands at a first position along the radial path; cutting a second strand of the plurality of strands at a second position that is proximate to and at an offset to the first position at the location along the radial path; and joining the first strand to the second strand at the first position and the second position at the location.

A twenty-first example includes the subject matter of the twentieth example, further comprising: providing a second winding that is substantially radially-symmetric to the first winding; and configuring, via the plurality of twistings, a substantially equal current distribution among the plurality of strands of the first winding.

A twenty-second example includes the subject matter of any one or more of the twentieth example thru the twenty-first example, further comprising: spanning, at the plurality of twistings, across the first strand and the second strand of the plurality of strands, wherein the first strand comprises an inner-most strand and the second strand comprises an outer-most strand of the plurality of strands.

A twenty-third example can be an apparatus of a monolithic inductor of a radio frequency integrated circuit comprising: a winding comprising a plurality of strands split and spaced apart from one another within a winding path comprising a winding width, wherein the winding path extends radially as an angular path at least three hundred and sixty degrees around a center point, wherein the plurality of strands are configured to increase an effective cross-section area of the winding available for conduction of radio frequency (RF) currents in response to the radio frequency integrated circuit operating within a Gigahertz frequency range; and a plurality of twistings located at different locations along the winding located at different locations along the winding, configured to couple to the winding at the different locations, and span across the plurality of strands of the winding at the different locations.

A twenty-fourth example includes the subject matter of the twenty-third example, further comprising: a second winding substantially radially-symmetric to and adjacent the winding for generating a radially-symmetric magnetic field; wherein the plurality of twistings are configured to enable a substantially equal current distribution among the plurality of strands of the winding.

A twenty-fifth example includes the subject matter of any one or more of the twenty-third example thru the twenty-fourth example, further comprising: a transformer comprising the monolithic inductor as a primary inductor with the plurality of twistings at the different locations of the winding, and a second monolithic inductor as a secondary inductor arranged substantially concentrically on a plane with respect to the monolithic inductor and configured to electromagnetically couple to, or mutually resonate with the primary inductor, wherein the second monolithic inductor comprises the second winding or at least one third winding.

Examples can include one or more non-transitory computer-readable media comprising instructions to cause an electronic device, upon execution of the instructions by one or more processors of the electronic device, to perform one or more elements of a method described in or related to any of examples above, or any other method or process described herein.

Examples can include an apparatus comprising logic, modules, or circuitry to perform one or more elements of a method described in or related to any of examples above, or any other method or process described herein.

Examples can include a method, technique, or process as described in or related to any of examples above, or portions or parts thereof.

Examples can include an apparatus comprising: one or more processors and one or more computer readable media comprising instructions that, when executed by the one or more processors, cause the one or more processors to perform the method, techniques, or process as described in or related to any of examples above, or portions thereof.

Examples can include a method of communicating in a wireless network as shown and described herein.

Examples can include a system for providing wireless communication as shown and described herein.

Examples can include a device for providing wireless communication as shown and described herein.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDM☐, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the acts and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. An apparatus of a monolithic inductor of a radio frequency integrated circuit comprising:
a first winding comprising a plurality of strands spaced apart from one another with a predetermined spacing;

a second winding substantially radially-symmetric to the first winding for generating a radially-symmetric magnetic field; and a plurality of twistings, located at different locations along the first winding, configured to couple to the first winding at the different locations, and span across the plurality of strands of the first winding at the different locations, wherein a twisting of the plurality of twistings comprises a path that twists an inner-most strand of the plurality of strands to a position of an outer-most strand of the plurality of strands along the first winding, or the outer-most strand to a position of the inner-most strand, and wherein at the twisting each of one or more strands located between the inner-most strand and the outer-most strand adjust to an adjacent strand position without spanning or hopping over another strand of the plurality of strands.

2. The apparatus of claim 1, wherein a twisting of the plurality of twistings is configured to cross-couple a first strand of the plurality of strands with a second strand of the plurality of strands at the different locations along the first winding.

3. The apparatus of claim 1, wherein the plurality of twistings is configured to enable a substantially equal current distribution among the plurality of strands of the first winding.

4. The apparatus of claim 1, wherein the plurality of strands are configured to increase an effective cross-section area of the first winding available for conduction of radio frequency (RF) currents, in response to the radio frequency integrated circuit operating at a frequency equal to or greater than one Gigahertz.

5. The apparatus of claim 1, wherein the second winding comprises a solid width that is about equal to a width of the first winding.

6. The apparatus of claim 1, wherein the plurality of strands comprises spacings between pairs of strands that are about equal to one another.

7. The apparatus of claim 1, wherein a twisting of the plurality of twistings is configured to increase a Quality (Q) factor of the first winding at an operating frequency range of the radio frequency integrated circuit.

8. The apparatus of claim 1, wherein a twisting of the plurality of twistings comprises an adjustment of at least one strand of the plurality of strands to a different position within the first winding extending about parallel between a first strand and a second strand of the plurality of strands in an angular path.

9. The apparatus of claim 1, wherein the different locations comprise at least one less in number along the first winding than the plurality of strands in the first winding.

10. The apparatus of claim 1, wherein the plurality of twistings are asymmetrically spaced, or symmetrically spaced, along an angular path of the first winding around a center point based on an angular field gradient.

11. A system of an inductor of a radio frequency integrated circuit comprising:

a monolithic inductor comprising a plurality of inductor windings, wherein the plurality of inductor windings comprises at least one first winding and at least one second winding, wherein the at least one first winding comprises a number of N strands that are split from one another and spaced apart within the first winding, wherein N comprises an integer equal to, or greater than, two; and a plurality of twisting components as twistings, at different locations along the at least one first winding, configured to span across the number of N strands of the at least one first inner winding at the different locations, wherein each of the plurality of twisting components is configured to cross-couple an inner-most strand of the number of N strands with an outer-most strand of the number of N strands at the different locations along the at least one first winding, and wherein at each of the plurality of twistings, each of one or more strands located between the inner-most strand and the outer-most strand adjust to an adjacent strand position without spanning or hopping over another strand of the number of N strands.

12. The system of claim 11, wherein inductor windings of the plurality of inductor windings are radially-symmetric to one another to generate a radially-symmetric magnetic field at an operating frequency range of the radio frequency integrated circuit, and comprise a same radial center.

13. The system of claim 11, further comprising:

a transformer comprising the monolithic inductor as a primary inductor with the plurality of twisting components at the different locations of the at least one first winding, and a second monolithic inductor as a secondary inductor arranged substantially concentrically on a plane with respect to the monolithic inductor and configured to electromagnetically couple to, or mutually resonate with the primary inductor.

14. The system of claim 11, further comprising:

a Q-shield configured to surround the monolithic inductor and isolate the monolithic inductor with the plurality of twisting components from outside interference fields, wherein the Q-shield comprises a solid strand, or a different plurality of strands with a different plurality of twisting components at locations along a radial path of the different plurality of strands.

15. The system of claim 11, wherein the at least one second winding comprises a solid metal winding including a width that is about equal to a width dimension of the at least one first winding, or a plurality of strands spaced apart from one another along the width dimension of the at least one second winding.

16. The system of claim 11, wherein the different locations comprise symmetrical, or asymmetrical positions, with respect to one another along a radial path of the at least one first winding based on an angular field gradient at the at least one second winding.

17. The system of claim 11, wherein the plurality of twisting components further comprises at least two connection points at the different locations for a path twisting the inner-most strand to a position of the outer-most strand, and at least one additional connection point to an extra path.

18. The system of claim 11, further comprising one or more winding crossings coupling one or more strands of the number of N strands between the inner-most strand and the outer-most strand of the at least one first winding with strands of the at least one second winding, wherein the one or more winding crossing comprise less strands than the number of N strands.

19. The system of claim 11, wherein the plurality of twisting components is equal to N−1 twistings components.

20. An apparatus of a monolithic inductor of a radio frequency integrated circuit comprising:

a winding comprising a plurality of strands split and spaced apart from one another within a winding path comprising a winding width, wherein the winding path extends radially as an angular path at least three hundred and sixty degrees around a center point, wherein the plurality of strands are configured to increase an effective cross-section area of the winding available for conduction of radio frequency (RF) currents in response to the radio frequency integrated circuit operating within a Gigahertz frequency range; and a plurality of twistings located at different locations along the winding located at different locations along the winding, configured to couple to the winding at the different locations, and span across the plurality of strands of the winding at the different locations, wherein at each twisting of the plurality of twistings comprises a path that twists an inner-most strand of the plurality of strands to a position of an outer-most strand of the plurality of strands along the first winding, or the outer-most strand to a position of the inner-most strand, and wherein at each twisting of the plurality of twistings each of one or more strands located between the inner-most strand and the outer-most strand adjust to an adjacent inward strand position without spanning or hopping over another strand of the plurality of strands.

21. The apparatus of claim 20, further comprising:

a second winding substantially radially-symmetric to and adjacent the winding for generating a radially-symmetric magnetic field;

wherein the plurality of twistings are configured to enable a substantially equal current distribution among the plurality of strands of the winding.

22. The apparatus of claim 21, further comprising:

a transformer comprising the monolithic inductor as a primary inductor with the plurality of twistings at the different locations of the winding, and a second monolithic inductor as a secondary inductor arranged substantially concentrically on a plane with respect to the monolithic inductor and configured to electromagnetically couple to, or mutually resonate with the primary inductor, wherein the second monolithic inductor comprises the second winding or at least one third winding.

* * * * *